US012620519B2

(12) United States Patent (10) Patent No.: US 12,620,519 B2

Sato (45) Date of Patent: May 5, 2026

(54) MULTILAYER ELECTRONIC COMPONENT

(71) Applicant: TDK CORPORATION, Tokyo (JP)

(72) Inventor: Takuya Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 781 days.

(21) Appl. No.: 17/896,440

(22) Filed: Aug. 26, 2022

(65) Prior Publication Data

US 2023/0083216 A1 Mar. 16, 2023

(30) Foreign Application Priority Data

Sep. 14, 2021 (JP) .................................. 2021-149382

(51) Int. Cl.
*H01F 27/28* (2006.01)
*H03H 7/01* (2006.01)

(52) U.S. Cl.
CPC ....... *H01F 27/2804* (2013.01); *H03H 7/0115* (2013.01); *H01F 2027/2809* (2013.01)

(58) Field of Classification Search
CPC ......... H01F 27/2804; H01F 2027/2809; H01F 27/40; H01F 2017/004; H01F 17/0013; H03H 7/0115; H03H 2001/0085; H03H 7/0123; H03H 7/1708; H03H 7/1766; H03H 7/1775; H03H 7/1791; H03H 7/463
USPC ...................................... 336/65, 83, 200, 232
See application file for complete search history.

(56) References Cited

U.S. PATENT DOCUMENTS

| | | | | |
|---|---|---|---|---|
| 9,203,373 B2 * | 12/2015 | Zuo | ......................... | H05K 1/165 |
| 2014/0062616 A1 | 3/2014 | Imamura | | |
| 2015/0061791 A1 * | 3/2015 | Imamura | .............. | H03H 7/0115 |
| | | | | 333/185 |
| 2017/0086289 A1 | 3/2017 | Takahashi | | |
| 2017/0187345 A1 | 6/2017 | Yun et al. | | |
| 2018/0006625 A1 | 1/2018 | Kaminishi | | |
| 2021/0257984 A1 * | 8/2021 | Sato | ..................... | H03H 7/1766 |

FOREIGN PATENT DOCUMENTS

| | | |
|---|---|---|
| JP | 2014-232815 A | 12/2014 |
| JP | 2015-159488 A | 9/2015 |
| JP | 2017-079362 A | 4/2017 |
| JP | 2019507972 A | 3/2019 |

OTHER PUBLICATIONS

Translation of Dec. 24, 2024 Office Action issued in Japanese Patent Application No. 2021-149382.
English Translation of May 20, 2025 Office Action issued in Japanese Patent Application No. 2021-149382.

* cited by examiner

*Primary Examiner* — Tuyen T Nguyen
(74) *Attorney, Agent, or Firm* — OLIFF PLC

(57) ABSTRACT

An electronic component includes a stack and an inductor wound about an axis orthogonal to a stacking direction. The inductor includes a first conductor layer portion and two through hole columns. The first conductor layer portion includes two conductor layers disposed at positions different from each other in the stacking direction and connected in parallel to each other. Area of a first conductor layer is larger than area of a second conductor layer.

11 Claims, 17 Drawing Sheets

731 735

732 733 734

MULTILAYER ELECTRONIC COMPONENT

BACKGROUND OF THE INVENTION

1. Field of the Invention

The present invention relates to a multilayer electronic component including an inductor.

2. Description of the Related Art

Compact mobile communication apparatuses are generally configured to use a single common antenna for a plurality of applications that use different systems and have different service frequency bands, and to use a branching filter to separate a plurality of signals received and transmitted by the antenna from each other.

A branching filter for separating a first signal of a frequency within a first frequency band and a second signal of a frequency within a second frequency band higher than the first frequency band from each other typically includes a common port, a first signal port, a second signal port, a first filter provided in a first signal path leading from the common port to the first signal port, and a second filter provided in a second signal path leading from the common port to the second signal port. As the first and second filters, LC resonators including inductors and capacitors are used, for example.

Among known branching filters are ones that use a stack including a plurality of dielectric layers stacked together, as disclosed in US 2018/0006625 A1. In addition, known inductors used in an LC resonator include an inductor in which via hole conductors are connected to respective ends of an inductor conductor layer as disclosed in US 2018/0006625 A1 and US 2014/0062616 A1. In US 2018/0006625 A1 and US 2014/0062616 A1, a plurality of inductor conductor layers having the same planar shape are stacked.

A stack constituting a branching filter is formed as described below, for example. First, a plurality of ceramic green sheets that eventually become a plurality of dielectric layers are produced. A plurality of unfired conductor layers that eventually become a plurality of conductor layers, and a plurality of unfired through holes that eventually become a plurality of through holes are formed on each ceramic green sheet. Next, the plurality of ceramic green sheets are stacked to produce a green sheet stack. Next, the green sheet stack is cut to produce an unfired stack. Next, a ceramic and a conductor in the unfired stack are fired through a low-temperature simultaneous firing process to complete the stack.

When a plurality of inductor conductor layers having the same planar shape are stacked as in the inductors disclosed in US 2018/0006625 A1 and US 2014/0062616 A1, displacement of the plurality of inductor conductor layers from one another due to displacement of the ceramic green sheets or the like causes characteristic change of the inductor.

The foregoing problem is not limited to branching filters and applies to multilayer electronic components in general that include an inductor.

SUMMARY OF THE INVENTION

An objective of the present invention is to provide a multilayer electronic component including an inductor that can reduce characteristic variation.

A multilayer electronic component of the present invention includes a stack including a plurality of dielectric layers that are stacked together, and at least one inductor integrated with the stack and wound about an axis orthogonal to a stacking direction of the plurality of dielectric layers. The at least one inductor includes a first through hole column, a second through hole column, and a first conductor layer portion connecting one end of the first through hole column and one end of the second through hole column. The first through hole column and the second through hole column are each constituted by two or more through holes connected in series to each other. The first conductor layer portion includes a first conductor layer and a second conductor layer disposed at positions different from each other in the stacking direction and connected in parallel to each other. Area of the first conductor layer is larger than area of the second conductor layer.

In the multilayer electronic component of the present invention, the second conductor layer may be disposed inside an outer edge of the first conductor layer in a view in one direction parallel to the stacking direction. A shape of the second conductor layer in a view in one direction parallel to the stacking direction may be similar to a shape of the first conductor layer in a view in one direction parallel to the stacking direction. The first conductor layer may be disposed between the second conductor layer and the axis.

In the multilayer electronic component of the present invention, the first conductor layer and the second conductor layer may each include a first portion extending in a first direction orthogonal to the stacking direction, and a second portion extending in a second direction orthogonal to the stacking direction. Alternatively, the first conductor layer and the second conductor layer may each extend in one direction orthogonal to the stacking direction.

In the multilayer electronic component of the present invention, the at least one inductor may include a plurality of inductors. In this case, the first conductor layer and the second conductor layer included in at least one of the plurality of inductors may each include a first portion and a second portion, the first portion extending in a first direction orthogonal to the stacking direction, the second portion extending in a second direction orthogonal to the stacking direction. The first conductor layer and the second conductor layer included in at least another one of the plurality of inductors may each extend in one direction orthogonal to the stacking direction.

In the multilayer electronic component of the present invention, the at least one inductor may further include a second conductor layer portion connected to the other end of the second through hole column. The second conductor layer portion may include a third conductor layer and a fourth conductor layer stacked in the stacking direction. Area of the fourth conductor layer may be larger than area of the third conductor layer. The fourth conductor layer may be disposed between the third conductor layer and the axis.

In the multilayer electronic component of the present invention, the first conductor layer portion of the at least one inductor includes the first conductor layer and the second conductor layer disposed at positions different from each other in the stacking direction and connected in parallel to each other. The area of the first conductor layer is larger than the area of the second conductor layer. Thus, according to the present invention, it is possible to reduce inductor characteristic variation.

Other and further objects, features and advantages of the present invention will appear more fully from the following description.

DETAILED DESCRIPTION OF THE PREFERRED EMBODIMENTS

Figure 1:
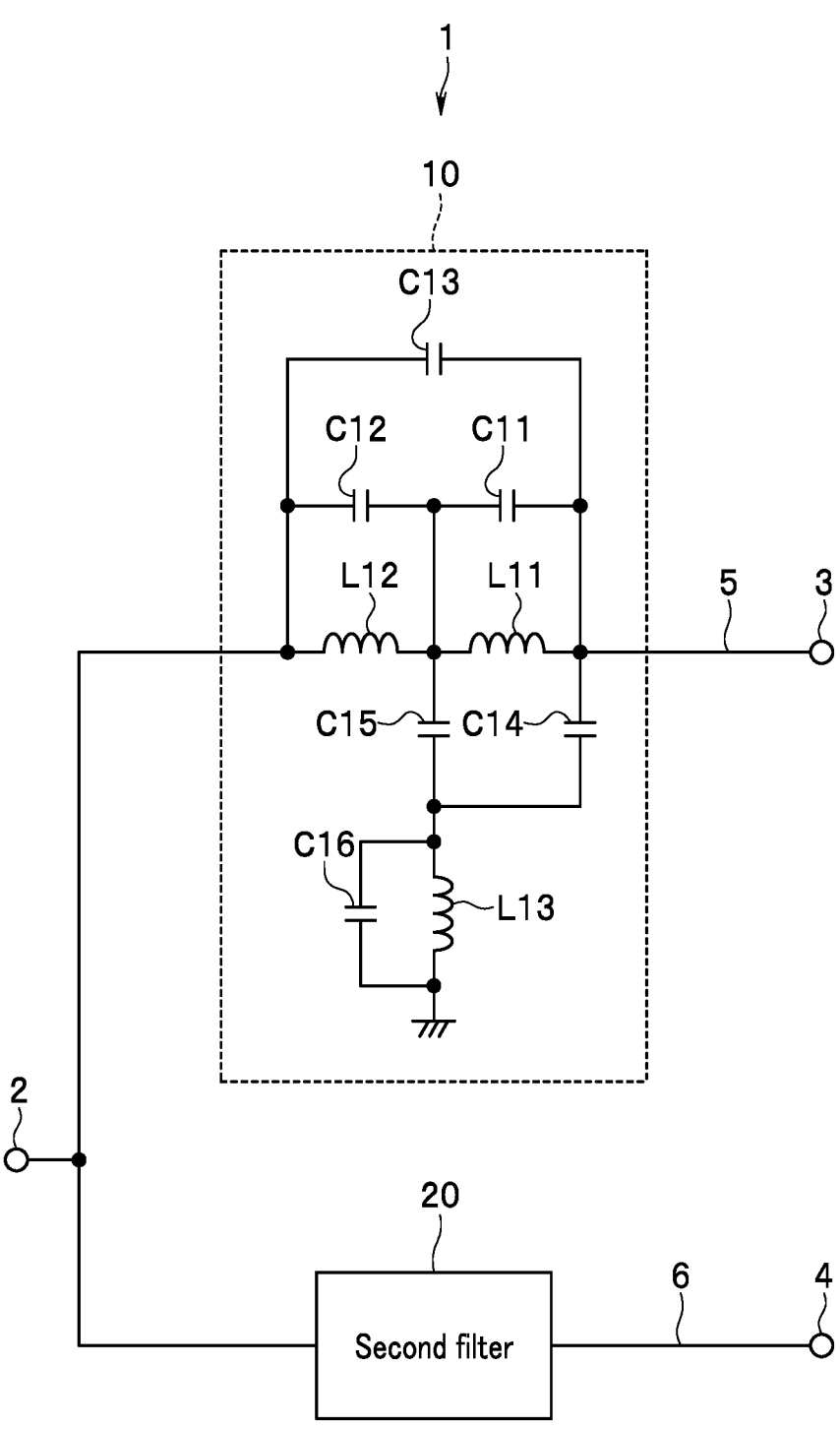
FIG. 1 is a circuit diagram showing a circuit configuration of a multilayer electronic component according to an embodiment of the invention.

An embodiment of the present invention will now be described in detail with reference to the drawings. First, the configuration of a multilayer electronic component (hereinafter simply referred to as electronic component) 1 according to the embodiment of the invention will be outlined with reference to FIG. 1. FIG. 1 shows a branching filter (diplexer) as an example of the electronic component 1. The branching filter includes a first filter 10 that selectively passes a first signal of a frequency within a first passband, and a second filter 20 that selectively passes a second signal of a frequency within a second passband higher than the first passband.

The electronic component 1 further includes a common port 2, a first signal port 3, a second signal port 4, a first signal path 5 connecting between the common port 2 and the first signal port 3, a second signal path 6 connecting between the common port 2 and the second port 4. In the circuit configuration, the first filter 10 is provided between the common port 2 and the first signal port 3, the second filter 20 is provided between the common port 2 and the second signal port 4. The first signal path 5 is a path leading from the common port 2 to the first signal port 3 via the first filter 10. The second signal path 6 is a path leading from the common port 2 to the second signal port 4 via the second filter 20.

The first signal of a frequency within the first passband selectively passes through the first signal path 5 on which the first filter 10 is provided. The second signal of a frequency within the second passband selectively passes through the second signal path 6 on which the second filter 20 is provided. In such a manner, the electronic component 1 separates the first signal and the second signal.

Next, an example of configuration of the first filter 10 will be described with reference to FIG. 1. The first filter 10 includes inductors L11, L12, and L13, and capacitors C11, C12, C13, C14, C15, and C16. In the circuit configuration, the inductors L11 and L12 are provided on the first signal path 5. In the circuit configuration, the inductor L11 is provided at a position closer to the first signal port 3 than the inductor L12. One end of the inductor L11 is connected to the first signal port 3. The other end of the inductor L11 is connected to one end of the inductor L12. The other end of the inductor L12 is connected to the common port 2.

The capacitor C11 is connected in parallel with the inductor L11. The capacitor C12 is connected in parallel with the inductor L12. One end of the capacitor C13 is connected to the one end of the inductor L11. The other end of the capacitor C13 is connected to the other end of the inductor L12.

One end of the capacitor C14 is connected to the one end of the inductor L11. One end of the capacitor C15 is connected to a connection point between the inductor L11 and the inductor L12. The other ends of the capacitors C14 and C14 are connected to one end of the inductor L13. The other end of the inductor L13 is connected to the ground. The capacitor C16 is connected in parallel with the inductor L13. In the circuit configuration, the inductor L13 is provided between the first signal path 5 and the ground.

Next, an example of configuration of the second filter 20 will be described with reference to FIG. 2. The second filter 20 includes inductors L21 and L22, and capacitors C21, C22, C23, C24, C25, C26, C27, C28, C29, C30, and C31. One end of the capacitor C21 is connected to the second signal port 4. The other end of the capacitor C21 is connected to one end of the capacitor C22. The other end of the capacitor C22 is connected to one end of the capacitor C23. The other end of the capacitor C23 is connected to the common port 2.

One end of the capacitor C24 is connected to the one end of the capacitor C21. The other end of the capacitor C24 is connected to the other end of the capacitor C22. One end of the capacitor C25 is connected to a connection point between the capacitor C22 and the capacitor C23.

In the circuit configuration, the inductor L21 is provided between the second signal path 6 and the ground. The inductor L<includes inductor portions 211 and 212. One end of the inductor portion 211 is connected to a connection point between the capacitor C21 and the capacitor C22. The other end of the inductor portion 211 is connected to one end of the inductor portion 212. The other end of the inductor portion 212 is connected to the ground.

In the circuit configuration, the inductor L22 is provided between the second signal path 6 and the ground. Furthermore, in the circuit configuration, the inductor L22 is provided at a position closer to the common port 2 than the inductor L21. The inductor L22 includes inductor portions 221 and 222. One end of the inductor portion 221 is connected to the other end of the capacitor C25. The other end of the inductor portion 221 is connected to one end of the inductor portion 222. The other end of the inductor portion 222 is connected to the ground.

The inductor portion 211 of the inductor L21 and the inductor portion 221 of the inductor L22 are magnetically coupled to each other. The inductor portion 212 of the inductor L21 and the inductor portion 222 of the inductor L22 are not magnetically coupled to each other.

The capacitor C26 is connected in parallel with the inductor portion 211 of the inductor L21. The capacitor C27 is connected in parallel with the inductor portion 212 of the inductor L21. One end of the capacitor C28 is connected to the one end of the inductor portion 211. The other end of the capacitor C28 is connected to the other end of the inductor portion 212.

The capacitor C29 is connected in parallel with the inductor portion 221 of the inductor L22. The capacitor C30 is connected in parallel with the inductor portion 222 of the inductor L22. One end of the capacitor C31 is connected to the one end of the inductor portion 221. The other end of the capacitor C31 is connected to the other end of the inductor portion 222.

Figure 3:
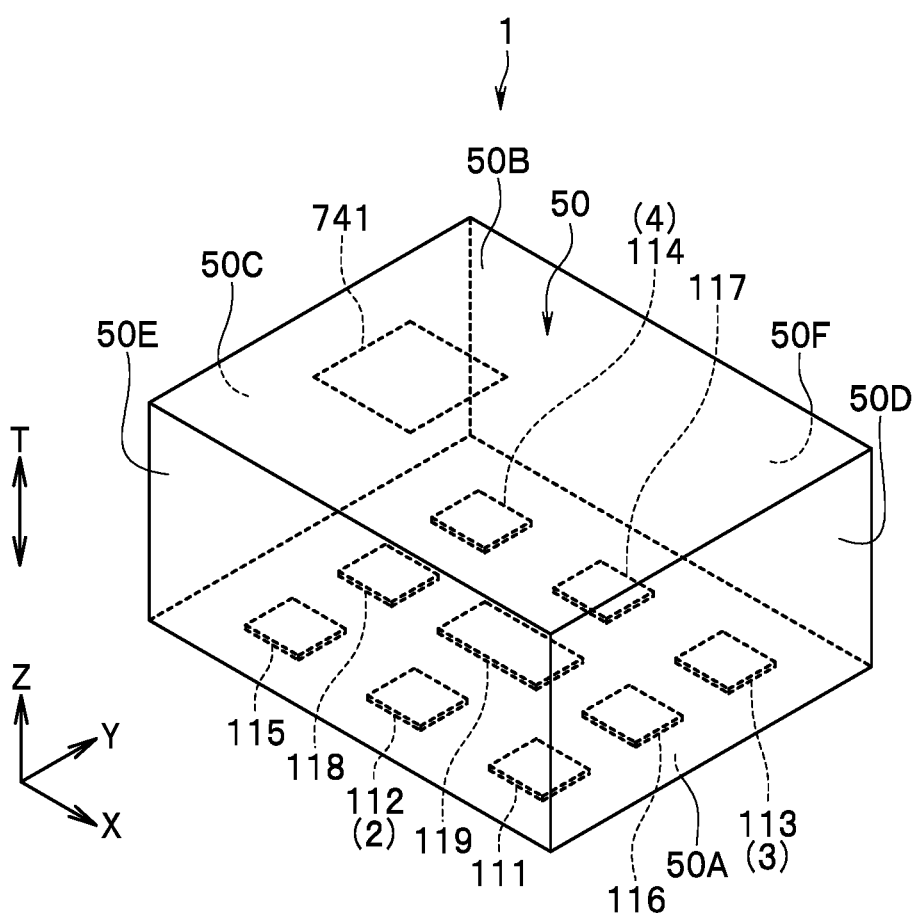
FIG. 3 is a perspective view showing an appearance of the multilayer electronic component according to the embodiment of the invention.

Next, other configurations of the electronic component 1 will be described with reference to FIG. 3. FIG. 3 is a perspective view showing an appearance of the electronic component 1.

The electronic component 1 further includes a stack 50 including a plurality of dielectric layers and a plurality of conductors stacked together. The stack 50 is intended to integrate the common port 2, the first signal port 3, the second signal port 4, the inductors L11, L12, L13, L21, and L22, and the capacitors C11 to C16 and C21 to C31. The first filter 10 and the second filter 20 are each constituted by using a plurality of conductors.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the top surface 50B and the bottom surface 50A.

Here, X, Y, and Z directions are defined as shown in FIG. 3. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively.

As shown in FIG. 3, the bottom surface 50A is located at the end of the stack 50 in the −Z direction. The top surface 50B is located at the end of the stack 50 in the Z direction. The bottom surface 50A and the top surface 50B each have a rectangular shape extending in the X direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

A planar shape of the stack 50, in other words, the shape of the bottom surface 50A (the shape of the top surface 50B) in a view in the Z direction is a rectangle. Long sides of the rectangle are parallel to the X direction, and short sides of the rectangle are parallel to the Y direction.

The electronic component 1 further includes signal terminals 112, 113, and 114 provided on the bottom surface 50A of the stack 50, and ground terminals 111, 115, 116, 117, 118, and 119 connected to the ground. The ground terminal 111 is disposed near a corner at a position where the bottom surface 50A, the side surface 50D, and the side surface 50E intersect one another. The signal terminal 113 is disposed near a corner at a position where the bottom surface 50A, the side surface 50D, and the side surface 50F intersect one another. The signal terminal 114 is disposed near a corner at a position where the bottom surface 50A, the side surface 50C, and the side surface 50F intersect one another. The ground terminal 115 is disposed near a corner at a position where the bottom surface 50A, the side surface 50C, and the side surface 50E intersect one another.

The signal terminal 112 is located between the ground terminal 111 and the ground terminal 115. The ground terminal 116 is located between the ground terminal 111 and the signal terminal 113. The ground terminal 117 is located between the signal terminal 113 and the signal terminal 114. The ground terminal 118 is located between the signal terminal 114 and the ground terminal 115. The ground terminal 119 is disposed at a center of the bottom surface 50A.

The terminal 112 corresponds to the common port 2, the signal terminal 113 to the first signal port 3, and the signal terminal 114 to the second signal port 4. The common port 2, the first signal port 3, and the second signal port 4 are thus provided on the bottom surface 50A of the stack 50.

Next, an example of the plurality of dielectric layers and the plurality of conductors constituting the stack 50 will be described with reference to FIG. 4A to FIG. 9B. In this example, the stack 50 includes twenty-four dielectric layers stacked together. The twenty-four dielectric layers will be referred to as a first to a twenty-fourth dielectric layer in the order from bottom to top. The first to twenty-fourth dielectric layers are denoted by reference numerals 51 to 74, respectively.

In FIG. 4A to FIG. 8C, each circle represents a through hole. The dielectric layers 51 to 72 each have a plurality of through holes. The through holes are each formed by filling a hole intended for a through hole with a conductive paste. Each of the through holes is connected to a conductor layer or another through hole.

Figure 4A:
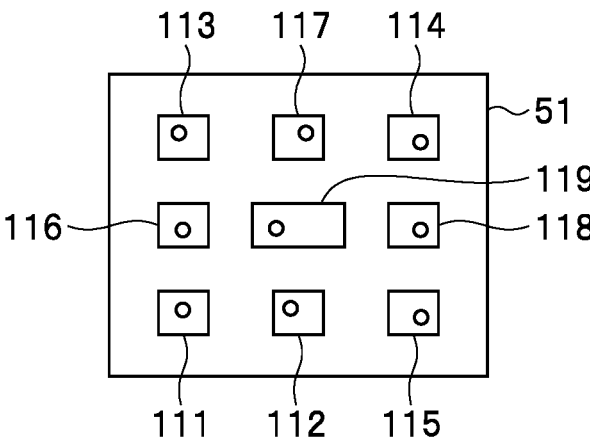
FIG. 4A to FIG. 4C are explanatory diagrams showing respective patterned surfaces of first to third dielectric layers of the stack of the multilayer electronic component according to the embodiment of the invention.
Figure 4B:
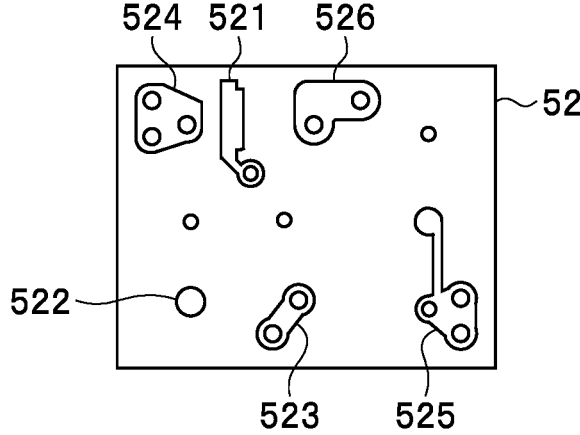

FIG. 4A shows the patterned surface of the first dielectric layer 51. The terminals 111 to 119 are formed on the patterned surface of the dielectric layer 51. FIG. 4B shows the patterned surface of the second dielectric layer 52. Conductor layers 521, 522, 523, 524, and 525 are formed on the patterned surface of the dielectric layer 52.

Figure 4C:
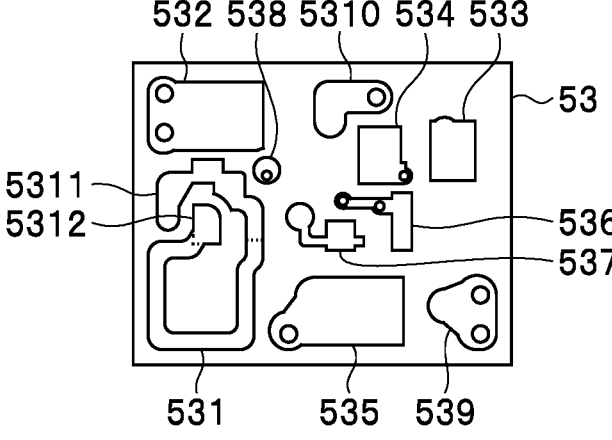

FIG. 4C shows the patterned surface of the third dielectric layer 53. Conductor layers 531, 532, 533, 534, 535, 536, 537, 538, 539, 5310, 5311, and 5312 are formed on the patterned surface of the dielectric layer 53. One end of the conductor layer 531 is connected to the conductor layer 5311. The other end of the conductor layer 531 is connected to the conductor layer 5312. In FIG. 4C, the boundary between the conductor layer 531 and the conductor layer 5311 and the boundary between the conductor layer 531 and the conductor layer 5312 are indicated by dotted lines.

Figure 5A:
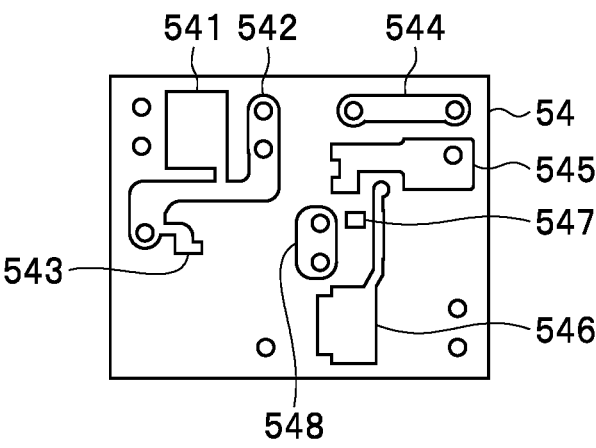
FIG. 5A to FIG. 5C are explanatory diagrams showing respective patterned surfaces of fourth to sixth dielectric layers of the stack of the multilayer electronic component according to the embodiment of the invention.
Figure 5B:
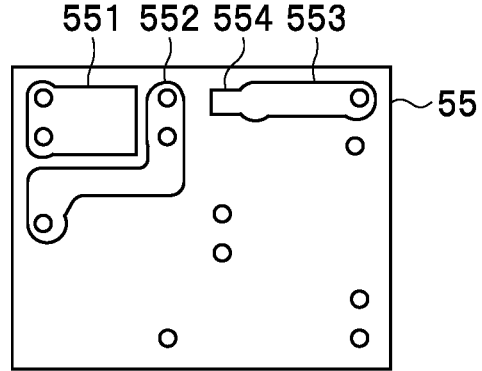
Figure 5C:
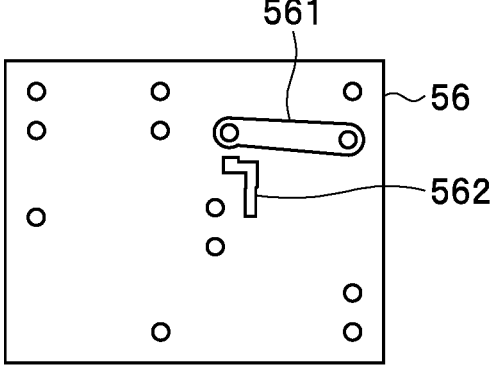

FIG. 5A shows the patterned surface of the fourth dielectric layer 54. Conductor layers 541, 542, 543, 544, 545, 546, 547, and 548 are formed on the patterned surface of the dielectric layer 54. The conductor layers 541 and 543 are connected to the conductor layer 542. FIG. 5B shows the patterned surface of the fifth dielectric layer 55. Conductor layers 551, 552, 553, and 554 are formed on the patterned surface of the dielectric layer 55. The conductor layer 554 is connected to the conductor layer 553. FIG. 5C shows the patterned surface of the sixth dielectric layer 56. Conductor layers 561 and 562 are formed on the patterned surface of the dielectric layer 56.

Figure 6A:
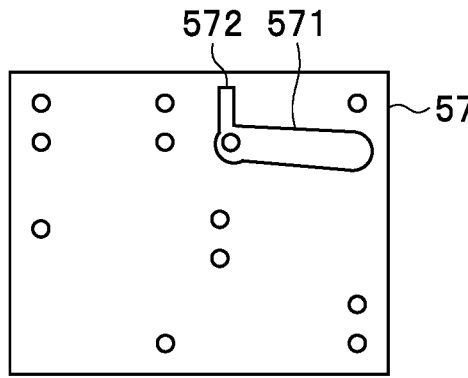
FIG. 6A to FIG. 6C are explanatory diagrams showing respective patterned surfaces of seventh to ninth dielectric layers of the stack of the multilayer electronic component according to the embodiment of the invention.
Figure 6B:
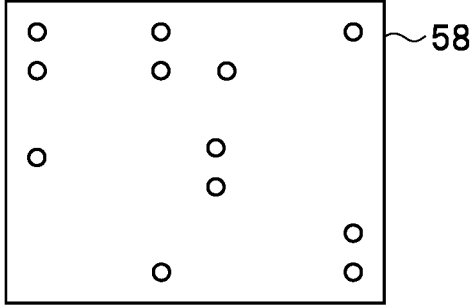
Figure 6C:
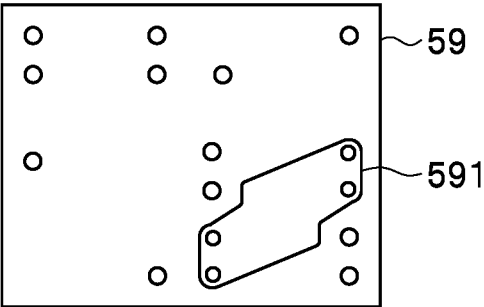

FIG. 6A shows the patterned surface of the seventh dielectric layer 57. Conductor layers 571 and 572 are formed on the patterned surface of the dielectric layer 57. The conductor layer 572 is connected to the conductor layer 571. FIG. 6B shows the patterned surface of the eighth dielectric layer 58. No conductor layer is formed on the patterned surface of the dielectric layer 58. FIG. 6C shows the patterned surface of the ninth dielectric layer 59. A conductor layer 591 is formed on the patterned surface of the dielectric layer 59.

Figure 7A:
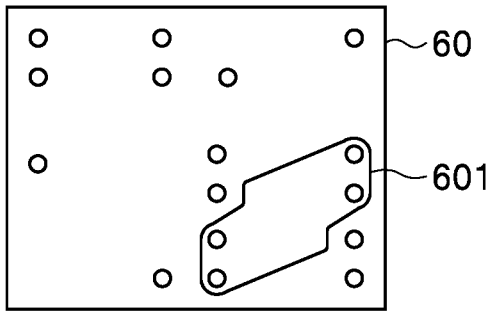
FIG. 7A to FIG. 7C are explanatory diagrams showing respective patterned surfaces of tenth to twelfth dielectric layers of the stack of the multilayer electronic component according to the embodiment of the invention.
Figure 7B:
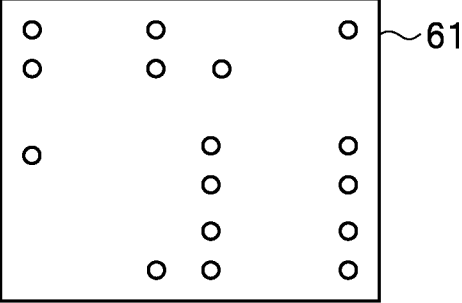
Figure 7C:
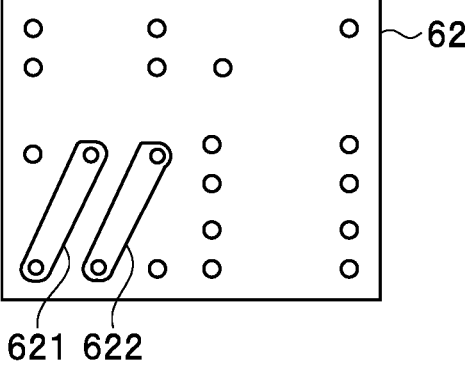

FIG. 7A shows the patterned surface of the tenth dielectric layer 60. A conductor layer 601 is formed on the patterned surface of the dielectric layer 60. FIG. 7B shows the patterned surface of the eleventh dielectric layer 61. No conductor layer is formed on the patterned surface of the dielectric layer 61. FIG. 7C shows the patterned surface of the twelfth dielectric layer 62. Conductor layers 621 and 622 are formed on the patterned surface of the dielectric layer 62. Shapes of the conductor layers 621 and 622 may be the same in a view in one direction (the Z direction) parallel to the stacking direction T.

Figure 8A:
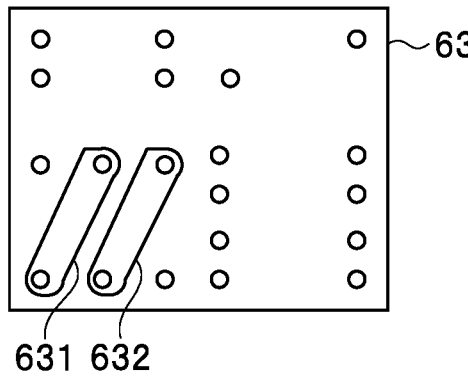
FIG. 8A is an explanatory diagram showing a patterned surface of a thirteenth dielectric layer of the stack of the multilayer electronic component according to the embodiment of the invention.
Figure 8B:
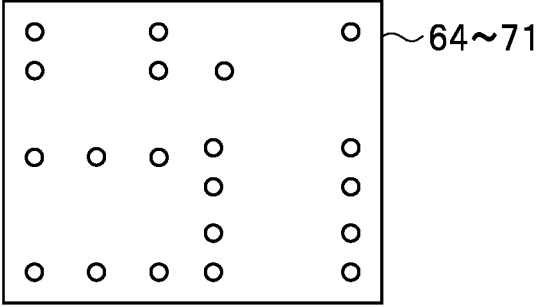
FIG. 8B is an explanatory diagram showing a patterned surface of each of fourteenth to twenty-first dielectric layers of the stack of the multilayer electronic component according to the embodiment of the invention.
Figure 8C:
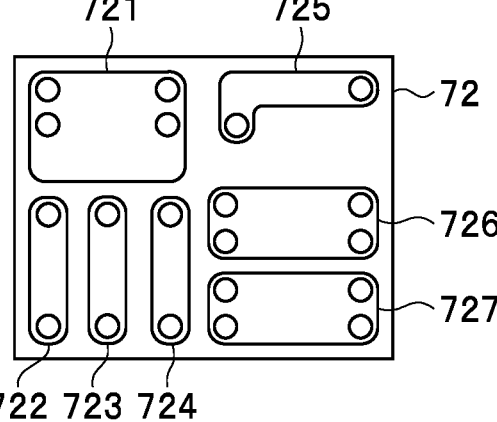
FIG. 8C is an explanatory diagram showing a patterned surface of a twenty-second dielectric layer of the stack of the multilayer electronic component according to the embodiment of the invention.

FIG. 8A shows the patterned surface of the thirteenth dielectric layer 63. Conductor layers 631 and 632 are formed on the patterned surface of the dielectric layer 63. Shapes of the conductor layers 631 and 632 may be the same in a view in one direction (the Z direction) parallel to the stacking direction T. FIG. 8B shows the patterned surface of each of the fourteenth to twenty-first dielectric layers 64 to 71. No conductor layer is formed on the patterned surface of the dielectric layers 64 to 71. FIG. 8C shows the patterned surface of the twenty-second dielectric layer 72. Conductor layers 721, 722, 723, 724, 725, 726, and 727 are formed on the patterned surface of the dielectric layer 72. Shapes of the conductor layers 722, 723, and 724 may be the same in a view in one direction (the Z direction) parallel to the stacking direction T. Shapes of the conductor layers 726 and 727 may be the same in a view in one direction (the Z direction) parallel to the stacking direction T.

Figure 9A:
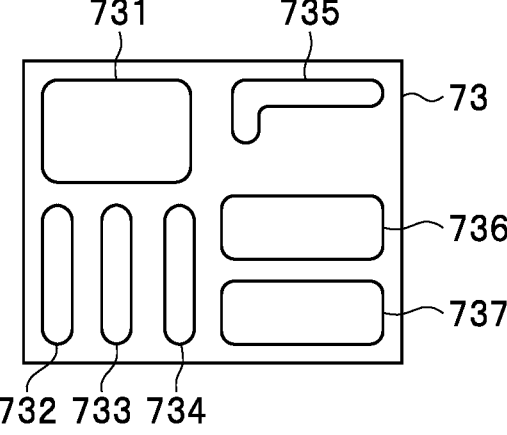
FIG. 9A and FIG. 9B are explanatory diagrams showing respective patterned surfaces of twenty-third and twenty-fourth dielectric layers of the stack of the multilayer electronic component according to the embodiment of the invention.
Figure 9B:
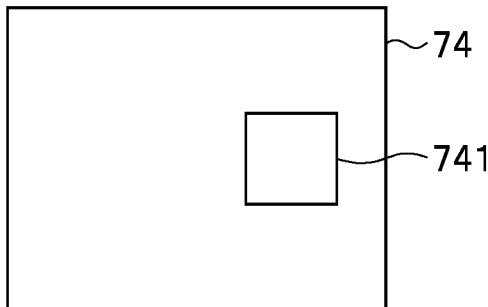

FIG. 9A shows the patterned surface of the twenty-third dielectric layer 73. Conductor layers 731, 732, 733, 734, 735, 736, and 737 are formed on the patterned surface of the dielectric layer 73. Shapes of the conductor layers 732, 733, and 734 may be the same in a view in one direction (the Z direction) parallel to the stacking direction T. Shapes of the conductor layers 736 and 737 may be the same in a view in one direction (the Z direction) parallel to the stacking direction T. FIG. 9B shows the patterned surface of the twenty-fourth dielectric layer 74. A mark 741 made of a conductor layer is formed on the patterned surface of the dielectric layer 74.

Figure 2:
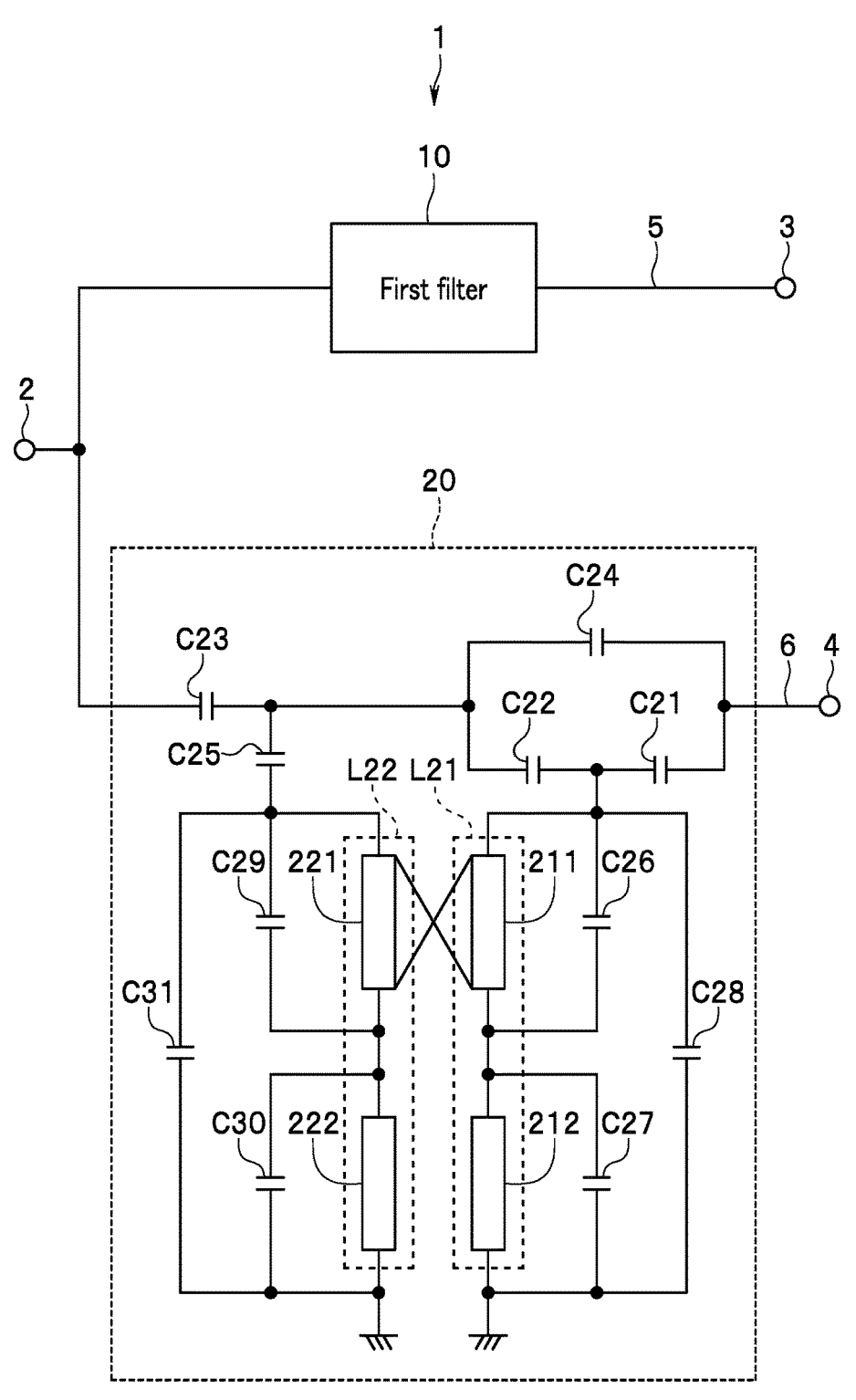
FIG. 2 is a circuit diagram showing the circuit configuration of the multilayer electronic component according to the embodiment of the invention.

The stack 50 shown in FIG. 2 is formed by stacking the first to twenty-fourth dielectric layers 51 to 74 such that the patterned surface of the first dielectric layer 51 serves as the bottom surface 50A of the stack 50 and the surface of the twenty-fourth dielectric layer 74 opposite to the patterned surface thereof serves as the top surface 50B of the stack 50.

Each of the plurality of through holes shown in FIG. 4A to FIG. 8C is connected to, when the first to twenty-second dielectric layers 51 to 72 are stacked, a conductor layer overlapping in the stacking direction T or to another through hole overlapping in the stacking direction T. Of the plurality of through holes shown in FIG. 4A to FIG. 8C, the ones located within a terminal or a conductor layer are connected to the terminal or conductor layer.

Figure 10:
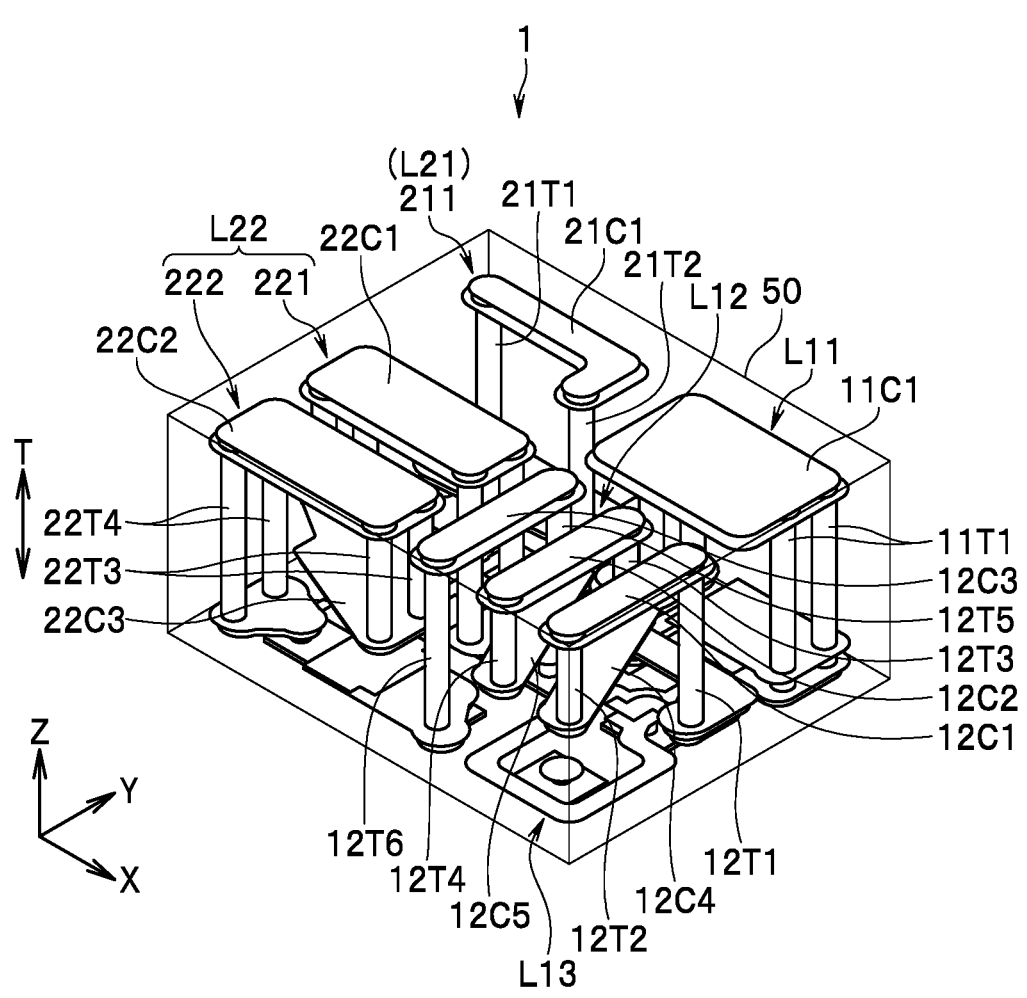
FIG. 10 is a perspective view showing an inside of the stack of the multilayer electronic component according to the embodiment of the invention.
Figure 11:
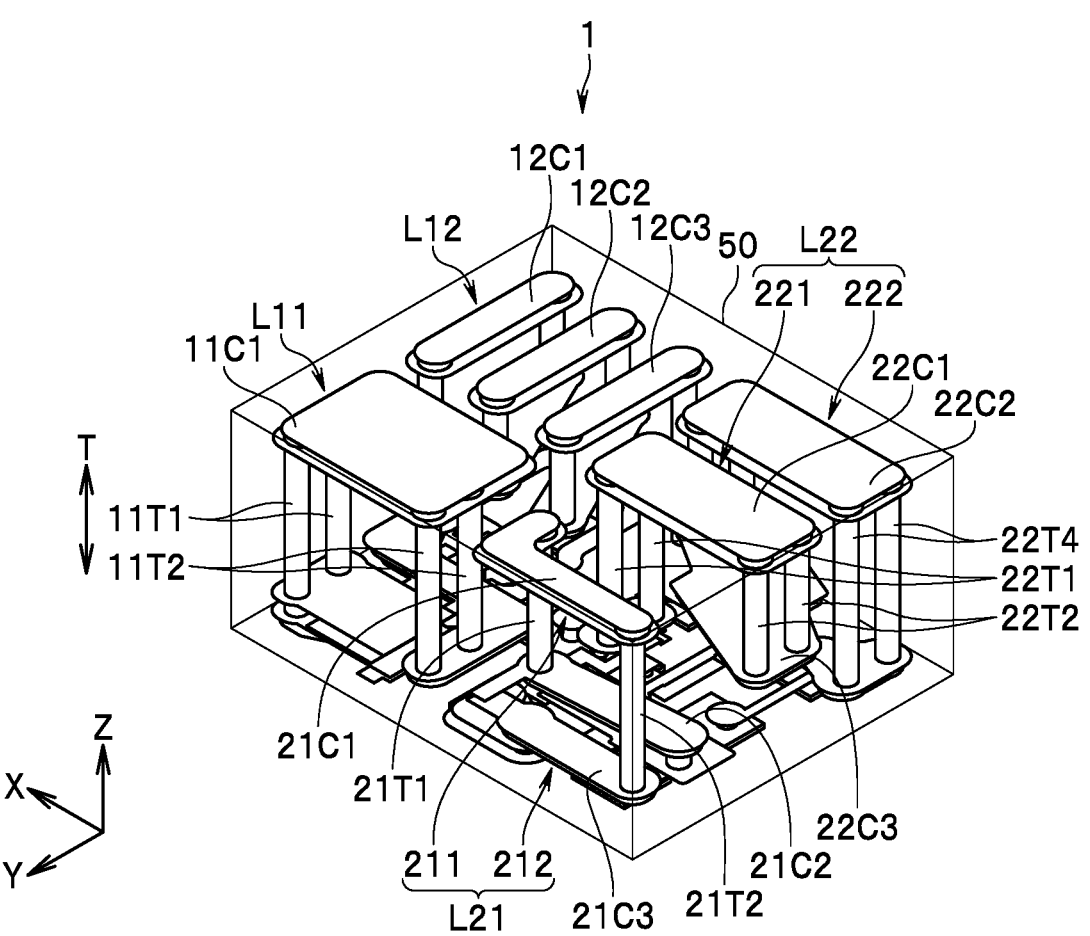
FIG. 11 is a perspective view showing the inside of the stack of the multilayer electronic component according to the embodiment of the invention.

FIG. 10 and FIG. 11 show an inside of the stack 50 formed by stacking the first to twenty-fourth dielectric layers 51 to 74. As shown in FIG. 10 and FIG. 11, the plurality of conductor layers and the plurality of through holes shown in FIG. 4A to FIG. 9A are stacked together inside the stack 50. In FIG. 10 and FIG. 11, the mark 741 is omitted.

For example, the stack 50 is fabricated by a low-temperature co-firing method, using ceramic as the material of the dielectric layers 51 to 74. In this case, a plurality of ceramic green sheets, which eventually become the dielectric layers 51 to 74, are fabricated first. Each ceramic green sheet has a plurality of unfired conductor layers formed thereon and a plurality of unfired through holes formed therein. The plurality of unfired conductor layers eventually become a plurality of conductor layers. The plurality of unfired through holes eventually become a plurality of through holes. Next, the plurality of ceramic green sheets are stacked together into a green sheet stack. The green sheet stack is then cut to form an unfired stack. The ceramic and conductor in the unfired stack are then fired by a low-temperature co-firing method to thereby complete the stack 50.

Figure 12:
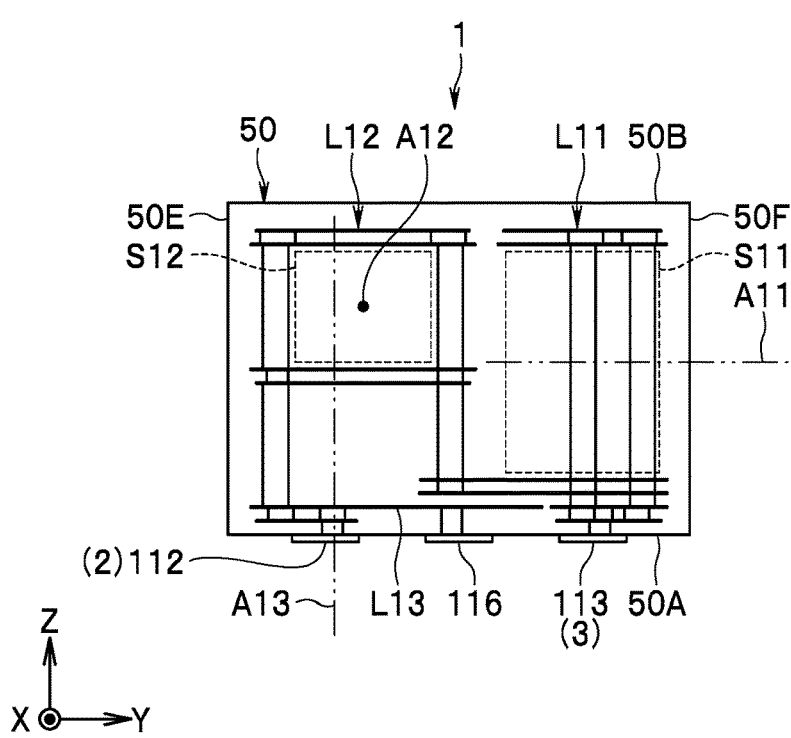
FIG. 12 is a side view showing a part of the inside of the stack shown in FIG. 10 and FIG. 11.
Figure 13:
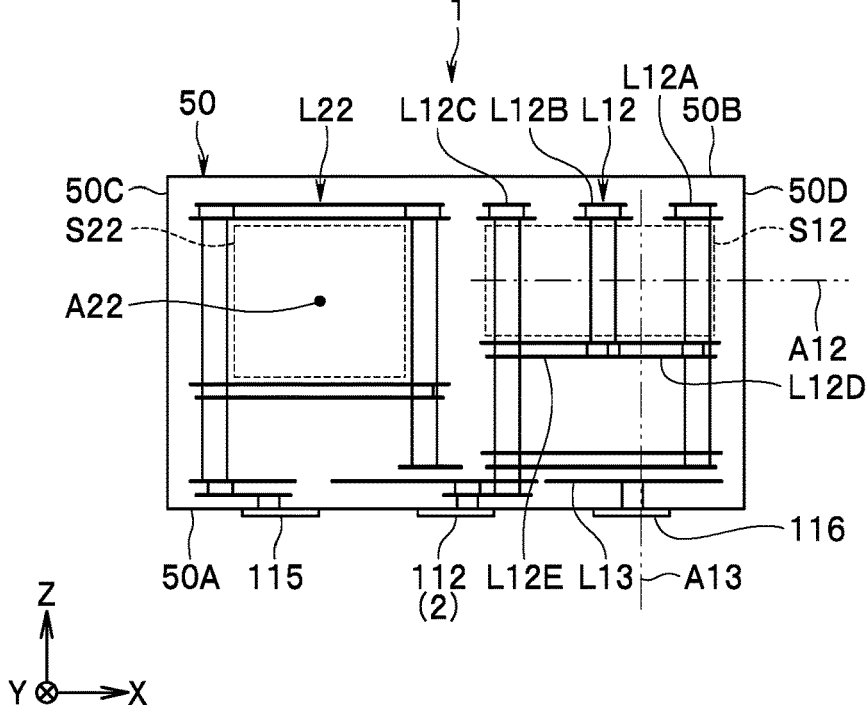
FIG. 13 is a side view showing a part of the inside of the stack shown in FIG. 10 and FIG. 11.
Figure 14:
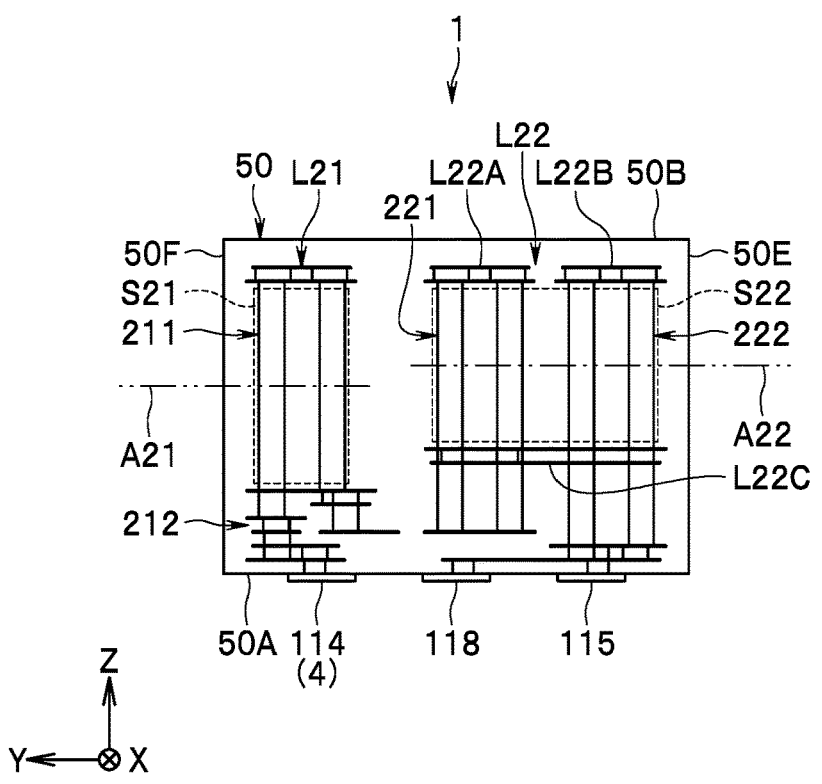
FIG. 14 is a side view showing a part of the inside of the stack shown in FIG. 10 and FIG. 11.
Figure 15:
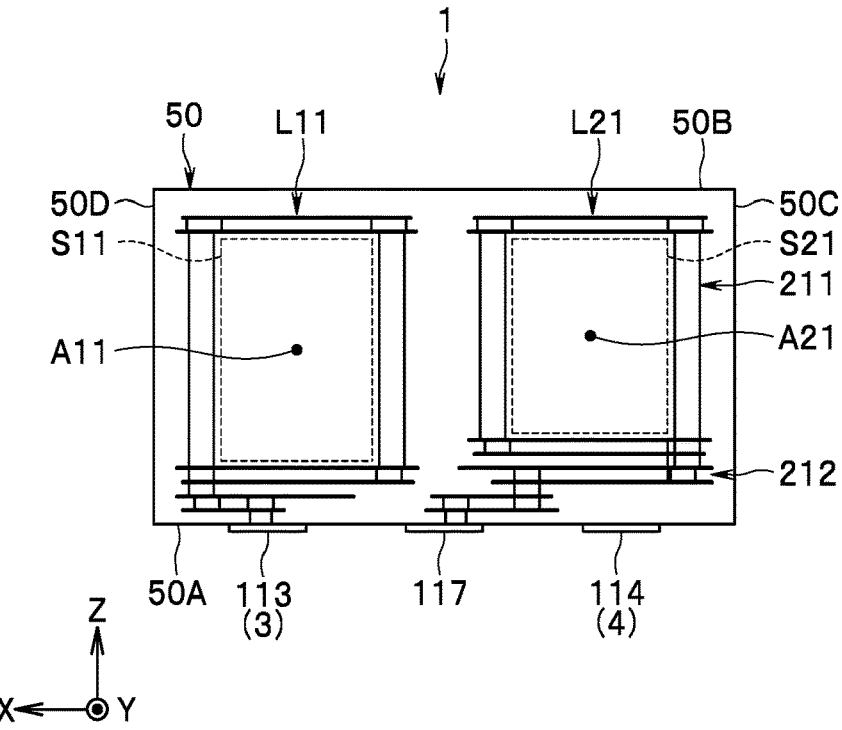
FIG. 15 is a side view showing a part of the inside of the stack shown in FIG. 10 and FIG. 11.

Next, configurations of the inductors L11, L12, L13, L21, and L22 will be described in detail with reference to FIG. 4A to FIG. 15. FIG. 12 to FIG. 15 are side views showing a part of the inside of the stack 50. FIG. 12 shows the part of the inside of the stack 50 in a view from the side surface 50D side and mainly shows the inductors L11, L12, and L13. FIG. 13 shows the part of the inside of the stack 50 in a view from the side surface 50E side and mainly shows the inductors L12, L13, and L22. FIG. 14 shows the part of the inside of the stack 50 in a view from the side surface 50C side and mainly shows the inductors L21 and L22. FIG. 15 shows the part of the inside of the stack 50 in a view from the side surface 50F side and mainly shows the inductors L11 and L21.

The inductors L11, L12, L13, L21, and L22 are each integrated with the stack 50. As described later, the inductors L11, L12, L21, and L22 each include a plurality of through hole columns. The plurality of through hole columns are each constituted by two or more through hole columns arranged in the stacking direction T and connected in series to each other.

First, the configuration of the inductor L11 will be described. As shown in FIG. 12 and FIG. 15, the inductor L11 is wound about an axis A11 parallel to a direction orthogonal to the stacking direction T. In the present embodiment, in particular, the axis A11 extends in a direction parallel to the Y direction.

The inductor L11 includes one conductor portion wound less than once about the axis A11. The conductor portion of the inductor L11 includes a conductor layer portion 11C1 (refer to FIG. 10 and FIG. 11). The conductor layer portion 11C1 has a shape that is long in a direction parallel to the X direction. The conductor layer portion 11C1 includes conductor layers 721 and 731 (refer to FIG. 8C and FIG. 9A) disposed at positions different from each other in the stacking direction T and connected in parallel to each other through four through holes. The conductor layers 721 and 731 each extend in the direction parallel to the X direction.

The conductor portion of the inductor L11 further includes two through hole columns 11T1 and two through hole columns 11T2 (refer to FIG. 10 and FIG. 11). The two through hole columns 11T1 are connected in parallel to a part near one end of the conductor layer portion 11C1 in a longitudinal direction. The two through hole columns 11T2 are connected in parallel to a part near the other end of the conductor layer portion 11C1 in the longitudinal direction.

Next, the configuration of the inductor L12 will be described. As shown in FIG. 12 and FIG. 13, the inductor L12 is wound about an axis A12 parallel to a direction orthogonal to the stacking direction T. In the present embodiment, in particular, the axis A12 extends in a direction parallel to the X direction. The inductor L12 includes conductor portions L12A, L12B, and L12C each wound less than once about the axis A12, a connection portion L12D connecting the conductor portions L12A and L12B in series, and a connection portion L12E connecting the conductor portions L12B and L12C in series.

The conductor portions L12A, L12B, and L12C include conductor layer portions 12C1, 12C2, and 12C3, respectively (refer to FIG. 10 and FIG. 11). The conductor layer portions 12C1, 12C2, and 12C3 each have a shape that is long in the direction parallel to the Y direction.

The conductor layer portion 12C1 includes conductor layers 722 and 732 (refer to FIG. 8C and FIG. 9A) disposed at positions different from each other in the stacking direction T and connected in parallel to each other through two through holes. The conductor layer portion 12C2 includes conductor layers 723 and 733 (refer to FIG. 8C and FIG. 9A) disposed at positions different from each other in the stacking direction T and connected in parallel to each other through two through holes. The conductor layer portion 12C3 includes conductor layers 724 and 734 (refer to FIG. 8C and FIG. 9A) disposed at positions different from each other in the stacking direction T and connected in parallel to each other through two through holes. The conductor layers 722 to 724 and 732 to 734 each extend in the direction parallel to the Y direction.

The conductor portion L12A further includes through hole columns 12T1 and 12T2 (refer to FIG. 10 and FIG. 11). The through hole column 12T1 is connected to a part near one end of the conductor layer portion 12C1 in a longitudinal direction. The through hole column 12T2 is connected to a part near the other end of the conductor layer portion 12C1 in the longitudinal direction.

The conductor portion L12B further includes through hole columns 12T3 and 12T4 (refer to FIG. 10 and FIG. 11). The through hole column 12T3 is connected to a part near one end of the conductor layer portion 12C2 in a longitudinal direction. The through hole column 12T4 is connected to a part near the other end of the conductor layer portion 12C2 in the longitudinal direction.

The conductor portion L12C further includes through hole columns 12T5 and 12T6 (refer to FIG. 10 and FIG. 11). The through hole column 12T5 is connected to a part near one end of the conductor layer portion 12C3 in a longitudinal direction. The through hole column 12T6 is connected to a part near the other end of the conductor layer portion 12C3 in the longitudinal direction.

The connection portion L12D connects the through hole column 12T2 of the conductor portion L12A and the through hole column 12T3 of the conductor portion L12B. The connection portion L12D includes a conductor layer portion 12C4 (refer to FIG. 10). The conductor layer portion 12C4 includes the conductor layers 621 and 631 (refer to FIG. 7C and FIG. 8A) disposed at positions different from each other in the stacking direction T and connected in parallel to each other through two through holes.

The connection portion L12E connects the through hole column 12T4 of the conductor portion L12B and the through hole column 12T5 of the conductor portion L12C. The connection portion L12E includes a conductor layer portion 12C5 (refer to FIG. 10). The conductor layer portion 12C5 includes the conductor layers 622 and 632 (refer to FIG. 7C and FIG. 8A) disposed at positions different from each other in the in the stacking direction T and connected in parallel to each other through two through holes.

The conductor layers 542 and 552 shown in FIG. 5A and FIG. 5B are disposed at positions different from each other in the stacking direction T and connected in parallel to each other through three through holes. The conductor layers 542 and 552 connects through hole columns 11T3 and 11T4 of the conductor portion of the inductor L11 and the through hole column 12T1 of the conductor portion L12A of the inductor L12.

Next, the configuration of the inductor L13 will be described. The inductor L13 is wound about an axis A13 parallel to the stacking direction T. The inductor L13 is constituted by the conductor layer 531 (refer to FIG. 4C).

Next, the configuration of the inductor L21 will be described. As shown in FIG. 14 and FIG. 15, the inductor L21 is wound about an axis A21 parallel to a direction orthogonal to the stacking direction T. In the present embodiment, in particular, the axis A21 extends in a direction parallel to the Y direction.

The inductor L21 includes one conductor portion wound less than once about the axis A21. The conductor portion of the inductor L21 includes a conductor layer portion 21C1 (refer to FIG. 10 and FIG. 11). The conductor layer portion 21C1 includes conductor layers 725 and 735 (refer to FIG. 8C and FIG. 9A) disposed at positions different from each other in the stacking direction T and connected in parallel to each other through two through holes. The conductor layers 725 and 735 each include a first portion extending in the X direction and a second portion extending in the Y direction.

The conductor portion of the inductor L21 further includes through hole columns 21T1 and 21T2 (refer to FIG. 10 and FIG. 11). The through hole column 21T1 is connected to a part near one end of the conductor layer portion 21C1 in a longitudinal direction. The through hole column 21T2 is connected to a part near the other end of the conductor layer portion 21C1 in the longitudinal direction.

The inductor L21 further includes conductor layer portions 21C2 and 21C3 (refer to FIG. 11). The conductor layer portion 21C1 connects one end of the through hole column 21T1 and one end of the through hole column 21T2. The conductor layer portion 21C2 is connected to the other end of the through hole column 21T1 and extends close to the other end of the through hole column 21T2. The conductor layer portion 21C3 is connected to the other end of the through hole column 21T2 and extends close to the other end of the through hole column 21T1.

The conductor layer portion 21C2 includes conductor layers 561 and 571 (refer to FIG. 5C and FIG. 6A) disposed at positions different from each other in the stacking direction T and connected in parallel to each other through two through holes. The conductor layer portion 21C3 includes conductor layers 544 and 553 (refer to FIG. 5A and FIG. 5B) disposed at positions different from each other in the stacking direction T and connected in parallel to each other through two through holes.

The conductor layer portions 21C1 and 21C2 and the through hole columns 21T1 and 21T2 constitute the inductor portion 211 of the inductor L21. The conductor layer portion 21C3 constitutes the inductor portion 212 of the inductor L21. The conductor layer portion 21C3 (conductor layers 544 and 553) is connected to the ground terminal 117 through the conductor layers 526 and 5310 (refer to FIG. 4B and FIG. 4C) and a plurality of through holes.

Next, the configuration of the inductor L22 will be described. As shown in FIG. 13 and FIG. 14, the inductor L22 is wound about an axis A22 parallel to a direction orthogonal to the stacking direction T. In the present embodiment, in particular, the axis A22 extends in a direction parallel to the Y direction. The inductor L22 includes conductor portions L22A and L22B each wound less than once about the axis A22, and a connection portion L22C connecting the conductor portions L22A and L22B in series.

The conductor portions L22A and L22B include conductor layer portions 22C1 and 22C2, respectively (refer to FIG. 10 and FIG. 11). The conductor layer portions 22C1 and 22C2 each have a shape that is long in the direction parallel to the X direction.

The conductor layer portion 22C1 includes conductor layers 726 and 736 (refer to FIG. 8C and FIG. 9A) disposed at positions different from each other in the stacking direction T and connected in parallel to each other through four through holes. The conductor layer portion 22C2 includes conductor layers 727 and 737 (refer to FIG. 8C and FIG. 9A) disposed at positions different from each other in the stacking direction T and connected in parallel to each other through four through holes. The conductor layers 726, 727, 736 and 737 each extend in the direction parallel to the X direction.

The conductor portion L22A further includes two through hole columns 22T1 and two through hole columns 22T2 (refer to FIG. 10 and FIG. 11). The two through hole columns 22T1 are connected in parallel to a part near one end of the conductor layer portion 22C1 in a longitudinal direction. The two through hole columns 22T2 are connected in parallel to a part near the other end of the conductor layer portion 22C1 in the longitudinal direction.

The conductor portion L22B further includes two through hole columns 22T3 and two through hole columns 22T4 (refer to FIG. 10 and FIG. 11). The two through hole columns 22T3 are connected in parallel to a part near one end of the conductor layer portion 22C2 in a longitudinal direction. The two through hole columns 22T4 are connected in parallel to a part near the other end of the conductor layer portion 22C2 in the longitudinal direction.

The connection portion L22C connects the two through hole columns 22T2 of the conductor portion L22A and the two through hole columns 22T3 of the conductor portion L22B. The connection portion L22C includes a conductor layer portion 22C3 (refer to FIG. 10 and FIG. 11). The conductor layer portion 22C3 includes the conductor layers 591 and 601 (refer to FIG. 6C and FIG. 7A) disposed at positions different from each other in the in the stacking direction T and connected in parallel to each other through four through holes.

The conductor layer portion L22A constitutes the inductor portion 221 of the inductor L22. The conductor layer portion L22B constitutes the inductor portion 222 of the inductor L22. In the circuit configuration, the conductor portion L22B is provided between the conductor portion L22A and the ground. The two through hole columns 22T4 of the conductor portion L22B are connected to the ground terminals 115 and 118 through the conductor layers 525 and 539 (refer to FIG. 4B and FIG. 4C) and a plurality of through holes.

Correspondences between the capacitors C11 to C16 and C21 to C31 and the internal components of the stack 50 shown in FIG. 4A to FIG. 9B will now be described. The capacitor C11 is composed of the conductor layers 521, 532, 541, and 551 shown in FIG. 4B to FIG. 5A, FIG. 8C, and FIG. 9A, and the dielectric layers 52, 53, and 54 each interposed between two of those conductor layers. The capacitor C12 is composed of the conductor layers 621, 622, 631, 632, 722 to 724, and 732 to 734 shown in FIG. 7C, FIG. 8A, FIG. 8C, and FIG. 9A, and the dielectric layers 62 and 72 each interposed between two of those conductor layers. The capacitor C13 is composed of the conductor layers 721 to 724 and 731 to 734.

The capacitor C14 is composed of the conductor layers 5311 and 532 shown in FIG. 4C. The capacitor C15 is composed of the conductor layer 5311, the conductor layer 542 shown in FIG. 5A, and the dielectric layer 53 interposed between two of those conductor layers. The capacitor C16 is composed of the conductor layers 5312 and 543 shown in FIG. 4C and FIG. 5A, and the dielectric layer 53 interposed between two of those conductor layers.

The capacitor C21 is composed of the conductor layers 533 and 545 shown in FIG. 4C and FIG. 5A, and the dielectric layer 53 interposed between those conductor layers. The capacitor C22 is composed of the conductor layers 534 and 545 shown in FIG. 4C, FIG. 5A, and FIG. 5C, and the dielectric layer 53 interposed between those conductor layers. The capacitor C23 is composed of the conductor layers 535 and 546 shown in FIG. 4C and FIG. 5A, and the dielectric layer 53 interposed between those conductor layers. The capacitor C24 is composed of the conductor layers 533 and 534. The capacitor C25 is composed of the conductor layers 536, 546, and 547 shown in FIG. 4C, FIG. 5A, and FIG. 5C, and the dielectric layer 53 interposed between two of those conductor layers.

The capacitor C26 is composed of the conductor layers 561, 571, 725, and 735 shown in FIG. 5C, FIG. 6A, FIG. 8C, and FIG. 9A, and the dielectric layers 56 and 72 interposed between two of those conductor layers. The capacitor C27 is composed of the conductor layers 544 and 553 shown in FIG. 5A and FIG. 5B, and the dielectric layer 54 interposed between those conductor layers. The capacitor C28 is composed of the conductor layers 554 and 572 shown in FIG. 5B and FIG. 6A, and the dielectric layers 55 and 56 each interposed between those conductor layers.

The capacitor C29 is composed of the conductor layers 591, 601, 726, and 736 shown in FIG. 6C, FIG. 7A, FIG. 8C, and FIG. 9A, and the dielectric layers 59 and 72 each interposed between two of those conductor layers. The capacitor C30 is composed of the conductor layers 591 and 601, and the conductor layers 727 and 737 shown in FIG. 8C and FIG. 9A, and the dielectric layers 59 and 72 each interposed between those conductor layers. The capacitor C31 is composed of the conductor layers 537 and 548 shown in FIG. 4C and FIG. 5A, and the dielectric layer 53 interposed between those conductor layers.

Figure 16:
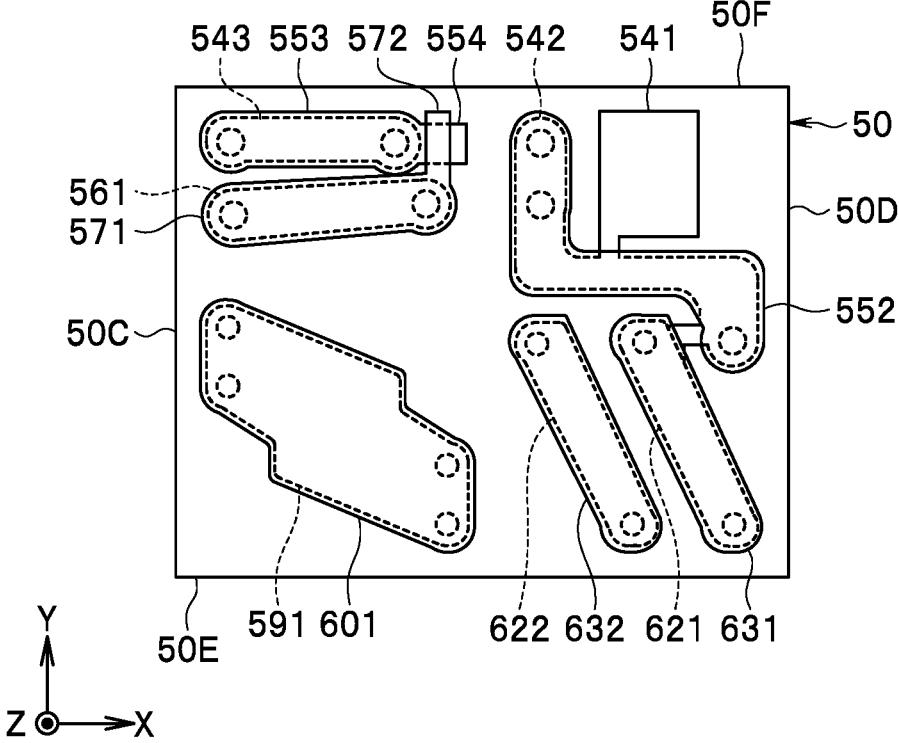
FIG. 16 is a plan view showing a part of the inside of the stack shown in FIG. 10 and FIG. 11.
Figure 17:
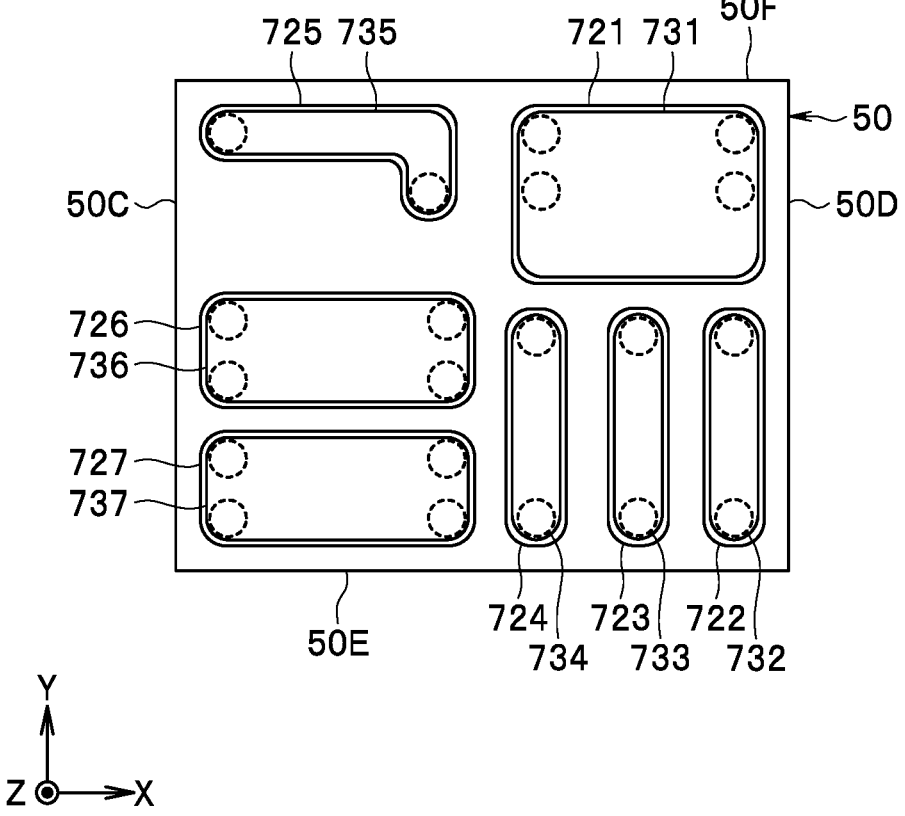
FIG. 17 is a plan view showing a part of the inside of the stack shown in FIG. 10 and FIG. 11.

Next, structural features of the electronic component 1 according to the present embodiment will be described with reference to FIG. 10 to FIG. 17. FIG. 16 and FIG. 17 are plan views showing a part of an inside of the stack 50 shown in FIG. 10 and FIG. 11.

As shown in FIG. 10 to FIG. 15, the inductor L12 is disposed after the inductor L11 in one direction orthogonal to the stacking direction T, in other words, the −Y direction. The inductor L21 and the inductor L22 are disposed after the inductor L11 and the inductor L12, respectively, in one direction orthogonal to the stacking direction T, in other words, the −X direction.

In FIG. 12 and FIG. 15, a region surrounded by a dashed line denoted by a reference numeral S11 shows a space including the axis A11 and surrounded by the inductor L11. In FIG. 12 and FIG. 13, a region surrounded by a dashed line denoted by a reference numeral S12 shows a space including the axis A12 and surrounded by the inductor L12. In FIG. 14 and FIG. 15, a region surrounded by a dashed line denoted by a reference numeral S21 shows a space including the axis A21 and surrounded by the inductor L21. In FIG. 13 and FIG. 14, a region surrounded by a dashed line denoted by a reference numeral S22 shows a space including the axis A22 and surrounded by the inductor L22.

In FIG. 15, the region surrounded by a dashed line denoted by the reference numeral S11 is also a region obtained by vertically projecting the space S11 onto a virtual plane (XZ plane) perpendicular to the axis A11. Hereinafter, the region is referred to as a projection region of the space S11. Area of the projection region of the space S11 corresponds to opening area of the inductor L11.

In FIG. 12, the region surrounded by a dashed line denoted by the reference numeral S12 is also a region obtained by vertically projecting the space S12 onto a virtual plane (YZ plane) perpendicular to the axis A12. Hereinafter, the region is referred to as a projection region of the space S12. Area of the projection region of the space S12 corresponds to opening area of the inductor L12.

In FIG. 15, the region surrounded by a dashed line denoted by the reference numeral S21 is also a region obtained by vertically projecting the space S21 onto a virtual plane (XZ plane) perpendicular to the axis A21. Hereinafter, the region is referred to as a projection region of the space S21. Area of the projection region of the space S21 corresponds to opening area of the inductor L21.

In FIG. 13, the region surrounded by a dashed line denoted by the reference numeral S22 is also a region obtained by vertically projecting the space S22 onto a virtual plane (XZ plane) perpendicular to the axis A22. Hereinafter, the region is referred to as a projection region of the space S22. Area of the projection region of the space S22 corresponds to opening area of the inductor L22.

As shown in FIG. 12 and FIG. 15, the area of the projection region of the space S11 is larger than the area of the projection region of the space S12. As shown in FIG. 12 and FIG. 15, the area of the projection region of the space S21 is larger than the area of the projection region of the space S12. As shown in FIG. 12 and FIG. 13, the area of the projection region of the space S22 is larger than the area of the projection region of the space S12.

As shown in FIG. 13 and FIG. 15, the area of the projection region of the space S21 and the area of the projection region of the space S22 are different from each other. In the present embodiment, in particular, the area of the projection region of the space S21 is larger than the area of the projection region of the space S22. A dimension of the projection region of the space S21 in the stacking direction T is larger than a dimension of the projection region of the space S22 in the stacking direction T.

The inductor L11 is disposed such that part of the space S11 overlaps at least part of the space S12 in a view in one direction (the Y direction) parallel to the axis A11.

The inductor L12 is disposed such that at least part of the space S12 overlaps the space S22 in a view in one direction (the X direction) parallel to the axis A12. The inductor L12 is disposed such that the axis A12 is parallel to the long sides of the bottom surface 50A of the stack 50 (the long sides of the top surface 50B).

The inductor L13 is disposed such that the axis A13 does not intersect the spaces S11, S21, and S22 but intersects the space S12. In other words, the inductor L13 is disposed such that the inductor L13 overlaps the inductor L12 in a view in the Z direction. No capacitor conductor layer used to constitute a capacitor is interposed between the inductor L12 and the inductor L13, more specifically, between the conductor layer 531 (refer to FIG. 4C) and the conductor layers 621 and 622 (refer to FIG. 7C).

The inductor L21 is disposed such that at least part of the space S21 overlaps at least part of the space S22 in a view in one direction (the Y direction) parallel to the axis A21. In other words, the inductor L22 is disposed such that at least part of the space S22 overlaps part of the space S21 in a view in one direction (the Y direction) parallel to the axis A22.

The conductor layer portion 21C3 of the inductor L21 is disposed between the conductor layer portion 21C1 of the inductor L21 and the bottom surface 50A. The conductor layer portion 21C3 extends across the signal terminal 114 in a view in one direction (the Z direction) parallel to the stacking direction T. The inductor L21 is electrically connected to the ground terminal 117. The inductor L22 is electrically connected to the ground terminals 115 and 118.

The inductor L22 includes the conductor portion L22A constituting the inductor portion 221 of the inductor L22, the conductor portion L22B constituting the inductor portion 222 of the inductor L22, and the connection portion L22C connecting the conductor portions L22A and L22B in series. The conductor portion L22A (inductor portion 221) is magnetically coupled to the conductor layer portions 21C1 and 21C2 constituting the inductor portion 211 of the inductor L21, and the through hole columns 21T1 and 21T2 in the inductor L21.

FIG. 17 shows the two conductor layers 721 and 731 constituting the conductor layer portion 11C1 of the inductor L11. As shown in FIG. 17, area of the conductor layer 721 is larger than area of the conductor layer 731. The conductor layer 731 is disposed inside an outer edge of the conductor layer 721 in a view in one direction (the Z direction) parallel to the stacking direction T. A shape of the conductor layer 731 in a view in the Z direction is similar to a shape of the conductor layer 721 in a view in the Z direction. The conductor layer 721 is disposed between the conductor layer 731 and the axis A11.

The above description on the conductor layers 721 and 731 also applies to pairs of the conductor layers 72x and 73x (x is an integer of two to seven). Description on the conductor layers 72x and 73x is obtained by replacing the conductor layers 721 and 731 in the above description on the conductor layers 721 and 731 with the conductor layers 72x and 73x, respectively. In a case of description on pairs of the conductor layers 72x and 73x constituting the inductor L12, the axis A11 in the above description is replaced with the axis A12. In a case of description on pairs of the conductor layers 725 and 735 constituting the inductor L21, the axis A11 in the above description is replaced with the axis A21. In a case of description on pairs of the conductor layers 72x and 73x constituting the inductor L22, the axis A11 in the above description is replaced with the axis A22.

FIG. 16 shows the two conductor layers 621 and 631 constituting the conductor layer portion 12C4 of the inductor L12. As shown in FIG. 16, area of the conductor layer 631 is larger than area of the conductor layer 621. The conductor layer 621 is disposed inside an outer edge of the conductor layer 631 in a view in one direction (the Z direction) parallel to the stacking direction T. A shape of the conductor layer 621 in a view in the Z direction is similar to a shape of the conductor layer 631 in a view in the Z direction. The conductor layer 631 is disposed between the conductor layer 621 and the axis A12.

The above description on the conductor layers 621 and 631 also applies to the pair of the conductor layers 622 and 632, the pair of the conductor layers 561 and 571, the pair of the conductor layers 543 and 553, and the pair of the conductor layers 591 and 601. Description on the conductor layers 622 and 632 is obtained by replacing the conductor layers 621 and 631 in the above description on the conductor layers 621 and 631 with the conductor layers 622 and 632, respectively.

Description on the conductor layers 561 and 571 or the conductor layers 543 and 553 is obtained by replacing the conductor layers 621 and 631 in the above description on the conductor layers 621 and 631 with the conductor layers 561 and 571 or the conductor layers 543 and 553, respectively, and replacing the axis A12 in the above description on the conductor layers 621 and 631 with the axis A21.

Description on the conductor layers 591 and 601 is obtained by replacing the conductor layers 621 and 631 in the above description on the conductor layers 621 and 631 with the conductor layers 591 and 601, respectively, and replacing the axis A12 in the above description on the conductor layers 621 and 631 with the axis A22.

Figure 18:
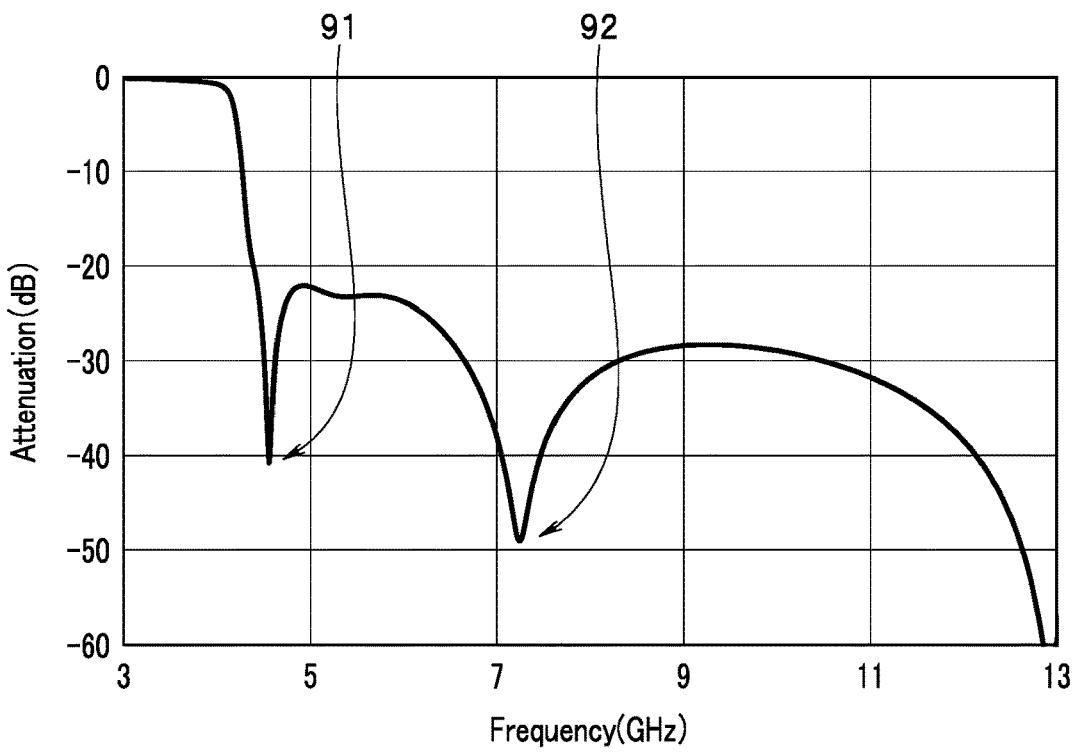
FIG. 18 is a characteristic diagram showing a pass characteristic between the common port and a first signal port in the multilayer electronic component according to the embodiment of the present invention.
Figure 19:
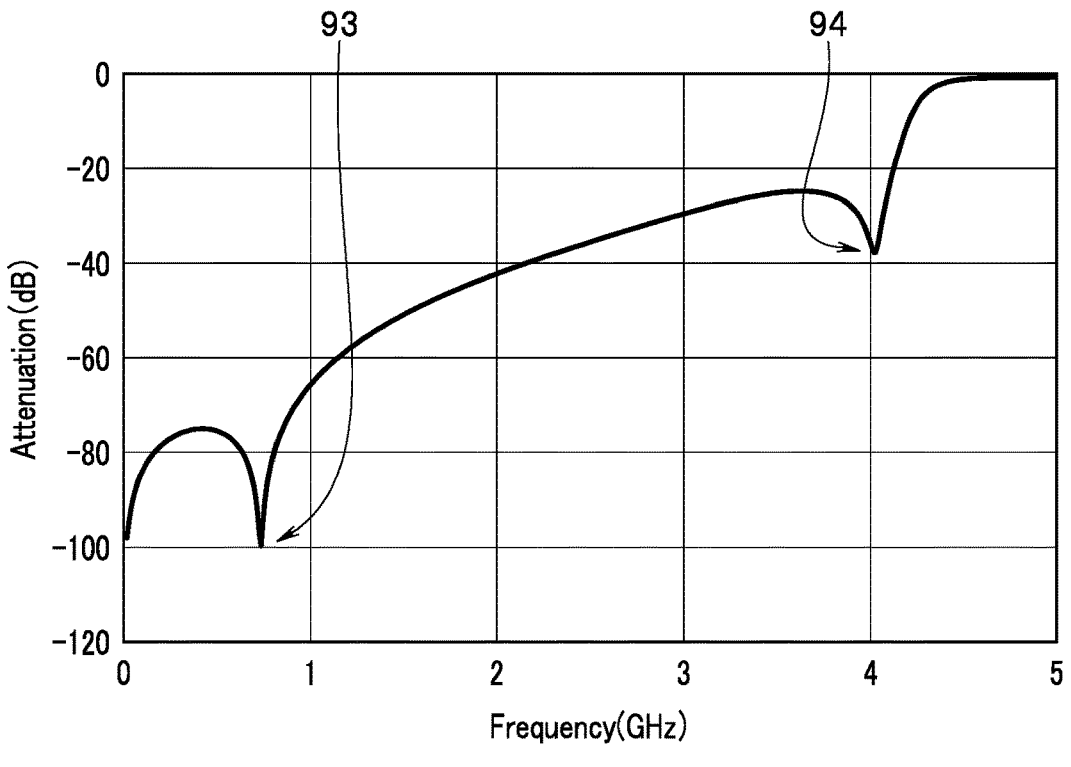
FIG. 19 is a characteristic diagram showing a pass characteristic between the common port and a second signal port in the multilayer electronic component according to the embodiment of the present invention.

Next, an example of the characteristics of the electronic component 1 according to the present embodiment will be described. FIG. 18 is a characteristic diagram showing a pass characteristic between the common port 2 and the first signal port 3, in other words, a pass characteristic of the first filter 10. FIG. 19 is a characteristic diagram showing a pass characteristic between the common port 2 and the second signal port 4, in other words, a pass characteristic of the second filter 20. In FIG. 18 and FIG. 19, the horizontal axis indicates frequency, and the vertical axis the attenuation.

In FIG. 18, a reference numeral 91 denotes an attenuation pole formed by the inductor L11, and a reference numeral 92 denotes an attenuation pole formed by the inductor L12. The inductor L12 forms the attenuation pole 92 on a high-pass side of the first passband in the pass characteristic of the first filter 10. The inductor L11 forms the attenuation pole 91 between the first passband and the attenuation pole 92 in the pass characteristic of the first filter 10. In other words, in the pass characteristic of the first filter 10, the attenuation pole 91 formed by the inductor L11 is closer to the first passband than the attenuation pole 92 formed by the inductor L12.

In FIG. 19, a reference numeral 93 denotes an attenuation pole formed by the inductor L21, and a reference numeral 94 denotes an attenuation pole formed by the inductor L22. The inductor L21 forms the attenuation pole 93 on a low-pass side of the second passband in the pass characteristic of the second filter 20. The inductor L22 forms the attenuation pole 94 between the attenuation pole 93 and the second passband in the pass characteristic of the second filter 20. In other words, in the pass characteristic of the second filter 20, the attenuation pole 94 formed by the inductor L22 is closer to the second passband than the attenuation pole 93 formed by the inductor L21.

Next, an example of inductance and a Q value of each of the inductors L11, L12, L13, L21, and L22 will be described. In the example, the inductance of the inductor L11 is 0.8 nH. The Q value of the inductor L11 is 125. The inductance of the inductor L12 is 3.4 nH. The Q value of the inductor L12 is 113. The inductance of the inductor L13 is 0.81 nH. The Q value of the inductor L13 is 53. The inductance of the inductor L21 is 1.5 nH. The Q value of the inductor L21 is 73. The inductance of the inductor L22 is 2.0 nH. The Q value of the inductor L22 is 127.

Now, the operation and effects of the electronic component 1 according to the present embodiment will be described. In the present embodiment, the conductor layer portion 21C1 of the inductor L21 includes the two conductor layers 725 and 735. As described above, in a manufacturing process of the stack 50, ceramic green sheets on which a plurality of unfired conductor layers and a plurality of unfired through holes are formed are stacked, the plurality of unfired conductor layers eventually becoming a plurality of conductor layers, the plurality of unfired through holes eventually becoming a plurality of through holes. A characteristic of the inductor L21 changes when the conductor layer 725 and the conductor layer 735 are displaced from each other due to displacement of the ceramic green sheets, the plurality of unfired conductor layers, or the like.

However, in the present embodiment, area of the conductor layer 725 is larger than area of the conductor layer 735. Thus, even if the conductor layer 735 is relatively displaced from the conductor layer 725, the conductor layer 735 entirely or mostly does not extend out of the conductor layer 725 in a view in one direction (the Z direction) parallel to the stacking direction T. Thus, according to the present embodiment, it is possible to reduce characteristic variation of the inductor L21 due to displacement of the conductor layer 725 and the conductor layer 735 from each other.

The above description on the conductor layers 725 and 735 also applies to pairs of the conductor layers 72x and 73x (x is an integer of one to four or an integer of six or seven), the pair of the conductor layers 621 and 631, the pair of the conductor layers 622 and 632, the pair of the conductor layers 561 and 571, the pair of the conductor layers 543 and 553, and the pair of the conductor layers 591 and 601. Thus, according to the present embodiment, it is possible to reduce characteristic variation of each of the first filter 10 and the second filter 20 due to displacement of the ceramic green sheets, the plurality of unfired conductor layers, or the like, and as a result, it is possible to reduce characteristic variation of the electronic component 1.

A shape of a conductor layer in a view in one direction (the Z direction) parallel to the stacking direction T is referred to as a planar shape of the conductor layer. In a view in one direction (the Z direction) parallel to the stacking direction T, a conductor layer having the larger area among the two conductor layers constituting each conductor layer portion may have a planar shape extending by 5 to 500 μm out of a conductor layer having the smaller area in every direction (direction parallel to an XY plane).

Next, the effects of the present embodiment will be described with reference to results of first to third simulations. First, the result of the first simulation on variation in the inductance of the inductor L21 will be described. In the first simulation, a model of the inductor L21 in the present embodiment and a model of an inductor of a first comparative example were used. Configuration of the inductor of the first comparative example is the same as the configuration of the inductor L21 except for the conductor layer portion 21C1. The inductor of the first comparative example includes a conductor layer portion of a comparative example in place of the conductor layer portion 21C1. The conductor layer portion of the comparative example includes a first conductor layer and a second conductor layer disposed at positions different from each other in the stacking direction T and connected in parallel to each other through two through holes. The second conductor layer is positioned after the first conductor layer in the Z direction.

In the first simulation, a planar shape of each of the first and second conductor layers is the same as a planar shape of the conductor layer 735 in the present embodiment. Specifically, conductor layers having the same planar shape are stacked at the conductor layer portion of the comparative example.

In the first simulation, the inductor L21 was designed such that the inductance of the inductor L21 is 1.452 nH, and the inductor of the first comparative example was designed such that inductance of the inductor of the first comparative example is 1.444 nH. A dimension of the planar shape of a conductor layer in a direction orthogonal to a longitudinal direction of the conductor layer is referred to as a width of the conductor layer. In the first simulation, a width of the conductor layer 725 of the inductor L21 was 225 μm, and a width of the conductor layer 735 of the inductor L21 was 175 μm. A width of each of the first and second conductor layers was 225 μm.

The first simulation calculated the inductance of the inductor L21 when the conductor layer 735 was displaced by 15 μm in each of the X direction, the −X direction, the Y direction, and the −Y direction. The first simulation also calculated the inductance of the inductor of the first comparative example when the second conductor layer was displaced by 15 μm in each of the X direction, the −X direction, the Y direction, and the −Y direction.

Table 1 and Table 2 show the result of the first simulation. Table 1 shows inductance values (in the unit of nH) obtained by the first simulation. Table 2 shows a change amount of inductance from a designed value when the conductor layer 735 and the second conductor layer were each displaced in the X direction, the −X direction, the Y direction, and the −Y direction. In the first simulation and the second simulation to be described later, the change amount is a value as a percentage expression of a value obtained by dividing, by inductance of a designed value, a difference between inductance obtained by the simulation and the inductance of the designed value. In Table 1 and Table 2, "First comparative example" and "L21" mean the model of the inductor of the first comparative example and the model of the inductor L21, respectively. In Table 1 and Table 2, "X direction", "−X direction", "Y direction", and "−Y direction" mean directions in which the conductor layer 735 or the second conductor layer was displaced.

TABLE 1

|  | Designed value | X direction | −X direction | Y direction | −Y direction |
|---|---|---|---|---|---|
| First comparative example | 1.444 | 1.452 | 1.462 | 1.442 | 1.454 |
| L21 | 1.452 | 1.450 | 1.453 | 1.448 | 1.452 |

TABLE 2

|  | X direction | −X direction | Y direction | −Y direction |
|---|---|---|---|---|
| First comparative example | 0.5% | 1.2% | −0.1% | 0.7% |
| L21 | −0.1% | 0.1% | −0.2% | 0.0% |

It is understood from Table 2 that an absolute value of the change amount of the inductance of the inductor L21 is smaller than an absolute value of the change amount of the inductance of the inductor of the first comparative example.

Next, the result of the second simulation on variation in the inductance of the inductor L12 will be described. In the second simulation, a model of the inductor L12 in the present embodiment and a model of an inductor of a second comparative example were used. Configuration of the inductor of the second comparative example is the same as the configuration of the inductor L12 except for the conductor layer portions 12C1, 12C2, and 12C3. The inductor of the second comparative example includes three conductor layer portions of the comparative example described above in place of the conductor layer portions 12C1 to 12C3. In the second simulation, shapes of first and second conductor layers of the conductor layer portion of the comparative example are the same as a planar shape of the conductor layer 732 in the present embodiment.

In the second simulation, the inductor L12 was designed such that the inductance of the inductor L12 is 3.289 nH, and the inductor of the second comparative example was designed such that inductance of the inductor of the second comparative example is 3.274 nH. In the second simulation, a width of each of the conductor layers 722, 723, and 724 of the inductor L12 was 246 μm, and a width of each of the conductor layers 732, 733, and 734 of the inductor L12 was 196 μm. A width of each of the first and second conductor layers was 246 μm.

The second simulation calculated the inductance of the inductor L12 when each of the conductor layers 722, 723, and 724 was displaced by 15 μm in each of the X direction, the −X direction, the Y direction, and the −Y direction. The second simulation also calculated the inductance of the inductor of the second comparative example when the second conductor layer of each of the three conductor layer portions was displaced by 15 μm in each of the X direction, the −X direction, the Y direction, and the −Y direction.

Table 3 and Table 4 show the result of the second simulation. Table 3 shows inductance values (in the unit of nH) obtained by the second simulation. Table 4 shows a change amount of inductance from a designed value when the conductor layers 722, 723, and 724 and the second conductor layer were each displaced in the X direction, the −X direction, the Y direction, and the −Y direction. In Table 3 and Table 4, "Second comparative example" and "L12" mean the model of the inductor of the second comparative example and the model of the inductor L12, respectively.

TABLE 3

| | Designed value | X direction | −X direction | Y direction | −Y direction |
|---|---|---|---|---|---|
| Second comparative example | 3.274 | 3.283 | 3.272 | 3.285 | 3.282 |
| L12 | 3.289 | 3.289 | 3.282 | 3.296 | 3.288 |

TABLE 4

| | X direction | −X direction | Y direction | −Y direction |
|---|---|---|---|---|
| Second comparative example | 0.3% | −0.1% | 0.3% | 0.2% |
| L12 | −0.0% | −0.2% | 0.2% | −0.1% |

It is understood from Table 4 that an absolute value of the change amount of the inductance of the inductor L12 is smaller than an absolute value of the change amount of the inductance of the inductor of the second comparative example.

As understood from the results of the first and second simulations, according to the present embodiment, it is possible to reduce inductor characteristic variation due to conductor layer displacement as compared to an inductor including a conductor layer portion at which conductor layers having the same planar shape are stacked.

It is understood from Table 2 and Table 4 that the change amount of the inductance of the inductor of the first comparative example is larger than the change amount of the inductance of the inductor of the second comparative example. Specifically, the inductance change amount when conductor layers are displaced is larger for an inductor, such as the inductor of the first comparative example or the inductor L21, including a conductor layer portion having an L-shaped planar shape than for an inductor, such as the inductor of the first comparative example or the inductor L12, including a conductor layer portion having a straight planar shape. This is thought to be because, in a conductor layer portion having an L-shaped planar shape, a shortest path between two through hole columns connected to each other through the conductor layer portion largely changes with conductor layer displacement. Thus, the effects of the present embodiment are more significantly exerted for an inductor including a conductor layer portion having an L-shaped planar shape.

The above description on an inductor including a conductor layer portion having an L-shaped planar shape also applies to an inductor including a conductor layer portion having a U-shaped planar shape and to an inductor including a conductor layer portion having a spiral planar shape.

Next, the result of the third simulation on characteristic variation of the electronic component 1 will be described. In the third simulation, a model of a practical example corresponding to the electronic component 1 according to the present embodiment and a model of an electronic component of a comparative example were used. Configuration of the electronic component of the comparative example is the same as configuration of the electronic component 1 except for conductor layer portions included in the inductors L11, L12, L21, and L22. The electronic component of the comparative example includes the above-described conductor layer portion of the comparative example as each conductor layer portion. The planar shape of each of the first and second conductor layers included in each conductor layer portion is the same as the planar shape of a conductor layer having the smaller area among the two conductor layers included in a conductor layer portion in the present embodiment corresponding to the conductor layer portion.

The third simulation calculated variation in frequency characteristics of the first filter 10 and the second filter 20 when a dielectric layer 23 was displaced by 15 μm in each of the X direction, the −X direction, the Y direction, and the −Y direction. A frequency at which attenuation is −10 dB when the frequency is increased from the first passband in the frequency characteristic of the first filter 10 is referred to as a first frequency. A frequency at which attenuation is −10 dB when the frequency is decreased from the second passband in the frequency characteristic of the second filter 20 is referred to as a second frequency. The third simulation calculated a change amount of the first frequency as variation in the frequency characteristic of the first filter 10. Specifically, a reference frequency was set to be the first frequency when a displacement amount of the dielectric layer 23 was 0 μm, and an absolute value of a value as a percentage expression of a value, obtained by dividing by the reference frequency a difference between the first frequency obtained by the third simulation and the reference frequency, was calculated as the change amount of the first frequency. As in the change amount of the first frequency, the third simulation also calculated a change amount of the second frequency as variation in the frequency characteristic of the second filter 20.

Table 5 and Table 6 show the result of the third simulation. Table 5 shows the change amount of the first frequency obtained by the third simulation. Table 6 shows the change amount of the second frequency obtained by the third simulation. In Table 5 and Table 6, "Comparative example" and "Practical example" mean the model of the electronic component of the comparative example and the model of the practical example, respectively. In Table 5 and Table 6, "X direction", "−X direction", "Y direction", and "−Y direction" mean directions in which the dielectric layer 23 was displaced.

TABLE 5

| | X direction | −X direction | Y direction | −Y direction | Average value |
|---|---|---|---|---|---|
| Comparative example | 0.021% | 0.058% | 0.004% | 0.004% | 0.022% |
| Practical example | 0.028% | 0.009% | 0.002% | 0.002% | 0.011% |

TABLE 6

| | X direction | −X direction | Y direction | −Y direction | Average value |
|---|---|---|---|---|---|
| Comparative example | 0.032% | 0.087% | 0.045% | 0.042% | 0.051% |
| Practical example | 0.044% | 0.016% | 0.014% | 0.005% | 0.020% |

It is understood from Table 5 and Table 6 that the change amount of the first frequency and the change amount of the second frequency are smaller for the electronic component 1 according to the present embodiment than for the electronic component of the comparative example. As understood from the result of the third simulation, according to the present embodiment, it is possible to reduce characteristic variation of the first filter 10 and the second filter 20, and as a result, it is possible to reduce characteristic variation of the electronic component 1.

Next, other effects of the present embodiment will be described. In the present embodiment, the area of the projection region of the space S11 corresponding to the opening area of the inductor L11 is larger than the area of the projection region of the space S12 corresponding to the opening area of the inductor L12. In other words, in the present embodiment, the area of the projection region of the space S12 corresponding to the opening area of the inductor L12 is smaller than the area of the projection region of the space S11 corresponding to the opening area of the inductor L11. Accordingly, a space for disposing another inductor can be formed near the inductor L12. In the present embodiment, the inductor L13 is disposed in the above-described space. As described above, the inductor L13 is disposed such that the axis A13 does not intersect the space S11 but intersects the space S12. In the present embodiment, the inductors L11, L12, and L13 are wound about respective axes parallel to directions different from one another. In the present embodiment, in particular, the axes A11, A12, and A13 are orthogonal to one another. Thus, according to the present embodiment, it is possible to prevent electromagnetic coupling among the inductors L11, L12, and L13 and also downsize the electronic component 1.

In the present embodiment, the inductor L11 is disposed such that part of the space S11 overlaps at least part of the space S12 in a view in one direction parallel to the axis A11. Thus, according to the present embodiment, it is possible to downsize the electronic component 1 as compared to configuration in which the space S11 and the space S12 do not overlap each other.

According to the present embodiment, the first filter 10 includes the inductors L11, L12, and L13. According to the present embodiment, it is possible to reduce a region of the first filter 10 in the stack 50 because of the above-described characteristics of the inductors L11, L12, and L13, and as a result, it is possible to downsize the electronic component 1.

In the present embodiment, the area of the projection region of the space S12 corresponding to the opening area of the inductor L12 is smaller than the area of the projection region of the space S22 corresponding to the opening area of the inductor L22. In the present embodiment, the inductors L12, L13, and L22 are wound about respective axes parallel to directions different from one another. In the present embodiment, in particular, the axes A12, A13, and A22 are orthogonal to one another. Thus, according to the present embodiment, it is possible to prevent electromagnetic coupling among the inductors L12, L13, and L22 and also downsize the electronic component 1.

In the present embodiment, the inductor L12 is disposed such that part of the space S12 overlaps at least part of the space S22 in a view in one direction parallel to the axis A12. Thus, according to the present embodiment, it is possible to downsize the electronic component 1 as compared to configuration in which the space S12 and the space S22 do not overlap each other.

In the present embodiment, no capacitor conductor layer is interposed between the inductor L12 and the inductor L13.

Thus, according to the present embodiment, it is possible to downsize the electronic component 1 as compared to configuration in which a capacitor conductor layer is interposed between the inductor L12 and the inductor L13.

In the present embodiment, the first filter 10 includes the inductors L12 and L13, and the second filter 20 includes the inductor L22. According to the present embodiment, it is possible to place the first filter 10 and the second filter 20 close to each other because of the above-described characteristics of the inductors L12, L13, and L22, and as a result, it is possible to downsize the electronic component 1.

Since the area of the projection region of the space S12 corresponding to the opening area of the inductor L12 is small, the inductance of the inductor L12 is relatively small. However, in the present embodiment, the inductor L12 includes the conductor portions L12A, L12B, and L12C each wound less than once about the axis A12. In other words, in the present embodiment, the inductor L12 is wound approximately three times about the axis A12. Thus, according to the present embodiment, it is possible to increase the inductance of the inductor L12. Moreover, according to the present embodiment, it is possible to increase a dimension of the inductor L12 in a direction parallel to the axis A12 (the direction parallel to the X direction). Thus, according to the present embodiment, it is possible to increase the space for disposing the inductor L13.

In the present embodiment, the inductor L12 is disposed such that the axis A12 is parallel to the long sides of the bottom surface 50A of the stack 50 (the long sides of the top surface 50B). Thus, according to the present embodiment, it is possible to dispose another inductor, specifically the inductor L22, in a direction parallel to the axis A12 and also wind the inductor L12 a plurality of times about the axis A12.

In the present embodiment, the inductors L11 and L12 are provided on the first signal path 5 in the circuit configuration, and the inductor L13 is provided between the first signal path 5 and the ground in the circuit configuration. The Q value of the inductor L13 may be smaller than the Q values of the inductors L11 and L12. As described above, in the example, the Q value of the inductor L11 is 125, the Q value of the inductor L12 is 113, and the Q value of the inductor L13 is 53. In the present embodiment, the inductors L11 and L12, which preferably have relatively large Q values, are inductors wound about an axis orthogonal to the stacking direction T, and the inductor L13, which may have a relatively small Q value, is an inductor wound about an axis parallel to the stacking direction T. The inductor L13, which may have a relatively small Q value, is disposed in the space formed near the inductor L12.

In the present embodiment, the inductor L21 is disposed such that part of the space S21 overlaps at least part of the space S22 in a view in one direction (the Y direction) parallel to the axis A21. In other words, the inductor L22 is disposed such that at least part of the space S22 overlaps part of the space S22 in a view in one direction (the Y direction) parallel to the axis A22. In the present embodiment, in particular, the axis A21 and the axis A22 are parallel to each other. Thus, in the present embodiment, the inductors L21 and L22 are disposed such that an opening of the inductor L21 and an opening of the inductor L22 face each other and the inductor L21 and the inductor L22 overlap each other in a view in the Y direction.

Consider a case in which magnetic coupling between the inductor L21 and the inductor L22 is adjusted. For example, the magnetic coupling can be adjusted by displacing one of the inductors L21 and L22 in the X direction or the −X direction. With this configuration, an unnecessary space is generated in the stack 50, and a planar shape of the electronic component 1 (shape in a view in the Z direction) becomes large.

However, in the present embodiment, the area of the projection region of the space S21 and the area of the projection region of the space S22 are different from each other. Thus, according to the present embodiment, it is possible to adjust the magnetic coupling without displacing one of the inductors L21 and L22 in the X direction or the −X direction.

Consider a case in which a dimension of the inductor L21 in the stacking direction T is increased to adjust the area of the projection region of the space S21. In this case, a distance from the bottom surface 50A of the stack 50 to the inductor L21 is shortened. When a ground terminal is provided near the inductor L21, floating capacitance is generated between the inductor L21 and the ground terminal and a desired characteristic is potentially not obtained.

However, in the present embodiment, the inductor L21 includes the conductor layer portion 21C2 connected to the other end of the through hole column 21T1 and extending close to the other end of the through hole column 21T2, and the conductor layer portion 21C3 connected to the other end of the through hole column 21T2 and extending close to the other end of the through hole column 21T1. According to the present embodiment, with at least one of the conductor layer portions 21C2 and 21C3, the inductor L21 can be disposed such that the inductor L21 does not overlap the ground terminal in a view in one direction (the Z direction) parallel to the stacking direction T. In the present embodiment, in particular, the conductor layer portion 21C3 extends across the signal terminal 114 in a view in one direction (the Z direction) parallel to the stacking direction T. Thus, according to the present embodiment, it is possible to adjust the area of the projection region of the space S21 by increasing the dimension of the inductor L21 in the stacking direction T.

With these effects, according to the present embodiment, it is possible to adjust electromagnetic coupling between the inductors L21 and L22 and also downsize the electronic component 1.

In the present embodiment, the electronic component 1 includes the second filter 20 including the inductors L21 and L22, and the first filter 10 including no inductors L21 and L22. To increase isolation between the first filter 10 and the second filter 20, it is conceivable to provide a ground terminal at a position sandwiched between the first filter 10 and the second filter 20. In the present embodiment, the conductor layer portion 21C3 is connected to the ground terminal 117 provided at a position sandwiched between the first filter 10 and the second filter 20. Thus, according to the present embodiment, it is possible to increase isolation between the first filter 10 and the inductor L21 and also connect the inductor L21 to the ground terminal 117 through the conductor layer portion 21C3.

In the present embodiment, the inductor L22 includes the conductor portions L22A and L22B. The conductor portion L22A is magnetically coupled to the inductor L21. Specifically, in the present embodiment, part of the inductor L22 is magnetically coupled to the inductor L21. According to the present embodiment, it is possible to adjust the magnetic coupling between the inductor L21 and the inductor L22 by configuring the inductors as described above.

In the present embodiment, in the inductor L11, two through hole columns are connected in parallel to a part near each end of the conductor layer portion 11C1 in the longitudinal direction. In addition, in the inductor L22, two through hole columns are connected in parallel to a part near each end of the conductor layer portion 22C1 in the longitudinal direction, and two through hole columns are connected in parallel to a part near each end of the conductor layer portion 22C2 in the longitudinal direction.

In the inductor L12, one through hole column is connected to a part near each end of the conductor layer portion 12C1 in the longitudinal direction, one through hole column is connected to a part near each end of the conductor layer portion 12C2 in the longitudinal direction, and one through hole column is connected to a part near each end of the conductor layer portion 12C3 in the longitudinal direction. In addition, in the inductor L21, one through hole column is connected to a part near each end of the conductor layer portion 21C1 in the longitudinal direction.

As described above, in the present embodiment, in each of the inductors L11 and L22, a plurality (two) of through hole columns are connected in parallel to one end of each conductor layer portion. Thus, according to the present embodiment, it is possible to increase the Q value of each of the inductors L11 and L22.

In the present embodiment, in each of the inductors L12 and L21, one through hole column is connected to one end of each conductor layer portion. Thus, according to the present embodiment, it is possible to downsize the electronic component 1 as compared to configuration in which a plurality of through hole columns are connected in parallel to one end of each conductor layer portion in each of the inductors L11, L12, L21, and L22.

In the first filter 10, it is preferable to increase the Q value of the inductor L11 with which the attenuation pole 91 closest to the first passband is formed. In the second filter 20, it is preferable to increase the Q value of the inductor L22 with which the attenuation pole 94 closest the second passband is formed. In the present embodiment, from such a viewpoint, in each of the inductors L11 and L22, a plurality (two) of through hole columns are connected in parallel to one end of each conductor layer portion so that the Q value of each of the inductors L11 and L22 increases.

In the present embodiment, the inductor L12 is disposed after the inductor L11 in the −Y direction, and the inductor L21 and the inductor L22 are disposed after the inductor L11 and the inductor L12, respectively, in the −X direction. In other words, in the present embodiment, the inductors L11 and L12 are arranged in line, and the inductors L21 and L22 are arranged in line at positions different from the inductors L11 and L12. Thus, according to the present embodiment, it is possible to reduce an unnecessary space generated in the stack 50 as compared to configuration in which the inductors L11 and L22 are arranged in line and the inductors L12 and L21 are arranged in line at positions different from the inductors L11 and L22, and as a result, it is possible to downsize the electronic component 1.

With these effects, according to the present embodiment, it is possible to increase the Q value of each of the inductors L11 and L22 and also downsize the electronic component 1.

In the present embodiment, the axis A11 about which the inductor L11 is wound and the axis A22 about which the inductor L22 is wound are parallel to each other. In the present embodiment, in particular, the axes A11 and A22 each extend in the direction parallel to the Y direction. In the inductors L11 and L22, each conductor layer portion has a shape that is long in the X direction. Thus, according to the present embodiment, it is possible to reduce a dimension of the stack 50 in the Y direction as compared to configuration in which the axis A11 and the axis A22 are orthogonal to each other.

In the present embodiment, the direction parallel to the axis A12 and the direction parallel to the axis A22 are orthogonal to each other. In the present embodiment, in particular, the direction parallel to the axis A12 is the direction parallel to the X direction, and the direction parallel to the axis A22 is the direction parallel to the Y direction. In the present embodiment, the inductor L12 is wound approximately three times about the axis A12 parallel to the X direction. As described above, each conductor layer portion in the inductor L22 has a shape that is long in the X direction. Thus, according to the present embodiment, it is possible to reduce an unnecessary space generated when the inductor L12 is wound a plurality of times about the axis A12 as compared to configuration in which the axis A22 is parallel to the X direction and each conductor layer portion in the inductor L22 has a shape that is short in the X direction.

MODIFICATION EXAMPLE

Figure 20A:
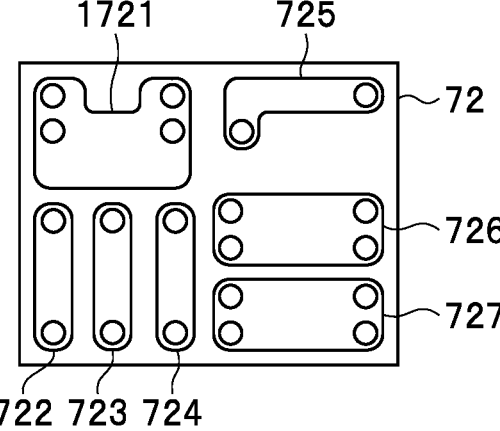
FIG. 20A and FIG. 20B are explanatory diagrams showing respective patterned surfaces of the twenty-second and twenty-third dielectric layers in a stack of a modification example of the multilayer electronic component according to the embodiment of the present invention.
Figure 20B:
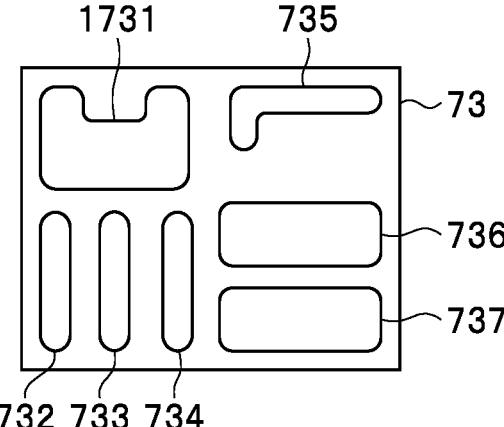

Next, a modification example of the electronic component 1 according to the present embodiment will be described with reference to FIG. 20A and FIG. 20B. In the modification example, configuration of the twenty-second dielectric layer 72 is different from the example shown in FIG. 8C. FIG. 20A shows a patterned surface of the twenty-second dielectric layer 72 in the modification example. A conductor layer 1721 is formed in place of the conductor layer 721 shown in FIG. 8C on the patterned surface of the dielectric layer 72 shown in FIG. 20A.

In the modification example, configuration of the twenty-third dielectric layer 73 is different from the example shown in FIG. 9A. FIG. 20B shows a patterned surface of the twenty-third dielectric layer 73 in the modification example. A conductor layer 1731 is formed in place of the conductor layer 731 shown in FIG. 9A on the patterned surface of the dielectric layer 73 shown in FIG. 20B.

The two conductor layers 1721 and 1731 constitute the conductor layer portion 11C1 of the inductor L11 (refer to FIG. 10 and FIG. 11). The conductor layers 1721 and 1731 are disposed at positions different from each other in the stacking direction T and connected in parallel to each other through four through holes. The conductor layers 1721 and 1731 each include a first portion extending in the X direction and two second portions extending in the Y direction.

Area of the conductor layer 1721 is larger than area of the conductor layer 1731. The conductor layer 1731 is disposed inside an outer edge of the conductor layer 1721 in a view in one direction (the Z direction) parallel to the stacking direction T. A shape of the conductor layer 1731 in a view in the Z direction is similar to a shape of the conductor layer 1721 in a view in the Z direction. The conductor layer 1721 is disposed between the conductor layer 1731 and the axis A11 (refer to FIG. 11 and FIG. 15).

The present invention is not limited to the foregoing embodiment, and various modifications may be made thereto. For example, the number of inductors included in each of the first filter 10 and the second filter 20 may be equal to or larger than three.

The axis A11 and the axis A12 may intersect each other at an angle other than 90°. Similarly, the axis A21 and the axis A22 may intersect each other at an angle other than 90°.

In each of the inductors L11 and L22, three or more through hole columns may be connected in parallel to one end of each conductor layer portion.

In each of the inductors L11, L12, L21, and L22, each conductor layer portion may include three or more conductor layers disposed at positions different from one another in the stacking direction T and connected in parallel to one another. When each conductor layer portion includes three conductor layers, a conductor layer having the smallest area among the three conductor layers may be interposed between the other two conductor layers. Alternatively, each conductor layer portion may be constituted by one conductor layer.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A multilayer electronic component comprising:
a stack including a plurality of dielectric layers that are stacked together;
a first inductor wound about a first axis orthogonal to a stacking direction of the plurality of dielectric layers; and
a second inductor wound about a second axis orthogonal to the stacking direction of the plurality of dielectric layers, wherein
the first inductor and the second inductor are disposed inside the stack and integrated with the stack,
each of the first inductor and the second inductor includes a first through hole column, a second through hole column, and a first conductor layer portion connecting one end of the first through hole column and one end of the second through hole column,
the first through hole column and the second through hole column of the first inductor are each constituted by two or more through holes connected in series to each other, the two or more through holes being formed in different dielectric layers of the plurality of dielectric layers,
the first conductor layer portion includes a first conductor layer and a second conductor layer that are formed on two dielectric layers of the plurality of dielectric layers and connected in parallel to each other, the two dielectric layers being disposed at positions different from each other in the stacking direction,
area of the first conductor layer is larger than area of the second conductor layer, and
the first axis and the second axis are orthogonal to each other.

2. The multilayer electronic component according to claim 1, wherein the second conductor layer is disposed inside an outer edge of the first conductor layer in a view in one direction parallel to the stacking direction.

3. The multilayer electronic component according to claim 1, wherein a shape of the second conductor layer in a view in one direction parallel to the stacking direction is similar to a shape of the first conductor layer in a view in one direction parallel to the stacking direction.

4. The multilayer electronic component according to claim 1, wherein the first conductor layer is disposed between the second conductor layer and the first axis or the second axis.

5. The multilayer electronic component according to claim 1, wherein the first conductor layer and the second conductor layer of at least one of the first inductor or the second inductor each include a first portion and a second portion, the first portion extending in a first direction orthogonal to the stacking direction, the second portion extending in a second direction orthogonal to the stacking direction.

6. The multilayer electronic component according to claim 1, wherein the first conductor layer and the second conductor layer of at least one of the first inductor or the second inductor each extend in one direction orthogonal to the stacking direction.

7. The multilayer electronic component according to claim 1, wherein the first conductor layer and the second conductor layer included in the first inductor each include a first portion and a second portion, the first portion extending in a first direction orthogonal to the stacking direction, the second portion extending in a second direction orthogonal to the stacking direction, and the first conductor layer and the second conductor layer included in the second inductor each extend in one direction orthogonal to the stacking direction.

8. The multilayer electronic component according to claim 1, wherein each of the first inductor and the second inductor further includes a second conductor layer portion connected to another end of the second through hole column, the second conductor layer portion includes a third conductor layer and a fourth conductor layer that are formed on other two dielectric layers of the plurality of dielectric layers, the other two dielectric layers being stacked in the stacking direction, and area of the fourth conductor layer is larger than area of the third conductor layer.

9. The multilayer electronic component according to claim 8, wherein the fourth conductor layer is disposed between the third conductor layer and the axis.

10. The multilayer electronic component according to claim 1, wherein each of the plurality of dielectric layers is formed of a ceramic green sheet.

11. The multilayer electronic component according to claim 1, wherein the first through hole column and the second through hole column of the second inductor are each constituted by two or more through holes connected in series to each other.

* * * * *